(12) United States Patent
Wang et al.

(10) Patent No.: US 12,713,965 B2
(45) Date of Patent: Aug. 18, 2026

(54) SEMICONDUCTOR PACKAGE AND METHOD FOR FORMING THE SAME

(71) Applicant: Taiwan Semiconductor Manufacturing Company, Ltd., Hsinchu (TW)

(72) Inventors: Chuei-Tang Wang, Taichung City (TW); Tso-Jung Chang, Taoyuan City (TW); Jeng-Shien Hsieh, Kaohsiung (TW); Chih-Peng Lin, Hsinchu County (TW); Chieh-Yen Chen, Taipei City (TW); Chen-Hua Yu, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 443 days.

(21) Appl. No.: 18/326,485

(22) Filed: May 31, 2023

(65) Prior Publication Data

US 2024/0404900 A1 Dec. 5, 2024

(51) Int. Cl.

| | |
|---|---|
| ***H10W 74/10*** | (2026.01) |
| ***G02B 6/12*** | (2006.01) |
| ***G02B 6/122*** | (2006.01) |
| ***G02B 6/136*** | (2006.01) |
| ***H10W 70/63*** | (2026.01) |
| ***H10W 74/01*** | (2026.01) |

(52) U.S. Cl.

CPC ....... *H10W 74/114* (2026.01); *G02B 6/12004* (2013.01); *G02B 6/1223* (2013.01); *G02B 6/136* (2013.01); *H10W 70/635* (2026.01); *H10W 74/016* (2026.01); *G02B 2006/12061* (2013.01)

(58) Field of Classification Search

CPC ............... H01L 23/3121; H01L 21/565; H01L 23/49827; G02B 6/12004; G02B 6/1223; G02B 6/136

See application file for complete search history.

(56) References Cited

U.S. PATENT DOCUMENTS

| | | | | |
|---|---|---|---|---|
| 10,873,399 | B2 * | 12/2020 | Peterson | H10D 86/01 |
| 11,362,077 | B2 * | 6/2022 | Chang | G02B 6/30 |
| 12,092,861 | B2 * | 9/2024 | Yu | G02B 6/4274 |
| 2014/0199019 | A1 * | 7/2014 | Yabre | G02B 6/4243 385/14 |
| 2017/0261703 | A1 * | 9/2017 | Bowen | G02B 6/423 |
| 2018/0039021 | A1 * | 2/2018 | Usami | G02B 6/12004 |
| 2020/0091124 | A1 | 3/2020 | Liao et al. | |
| 2020/0174187 | A1 * | 6/2020 | Chang | G02B 6/12 |
| 2021/0096310 | A1 * | 4/2021 | Chang | H01L 24/19 |
| 2021/0096311 | A1 * | 4/2021 | Yu | G02B 6/12004 |
| 2023/0077979 | A1 | 3/2023 | Winzer | |
| 2023/0161120 | A1 | 5/2023 | Yu et al. | |

* cited by examiner

*Primary Examiner* — Tina Wong

(74) *Attorney, Agent, or Firm* — Birch, Stewart, Kolasch & Birch, LLP

(57) ABSTRACT

A method for forming a semiconductor package is provided. The method includes forming a first photonic routing structure over a substrate, disposing the first photonic routing structure over a redistribution structure, disposing a second photonic routing structure and an optical engine die on the redistribution structure and forming a molding structure between and separating the first photonic routing structure and the second photonic routing structure.

20 Claims, 21 Drawing Sheets

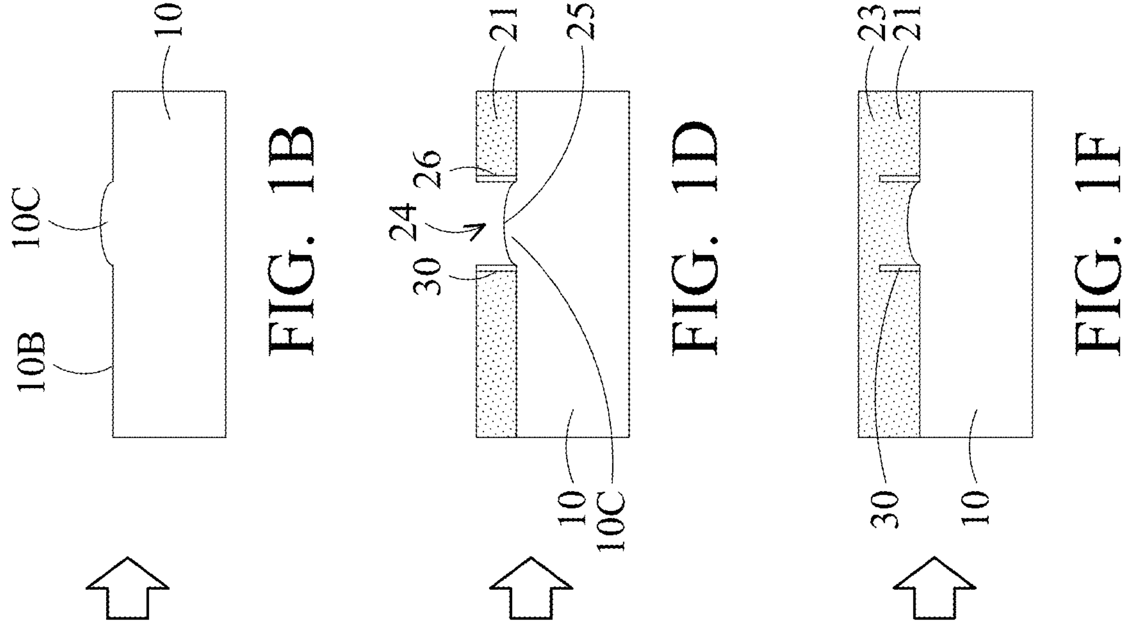
10
10B
10C
FIG. 1B
21
25
26
24
30
10
10C
FIG. 1D
23
21
30
10
FIG. 1F
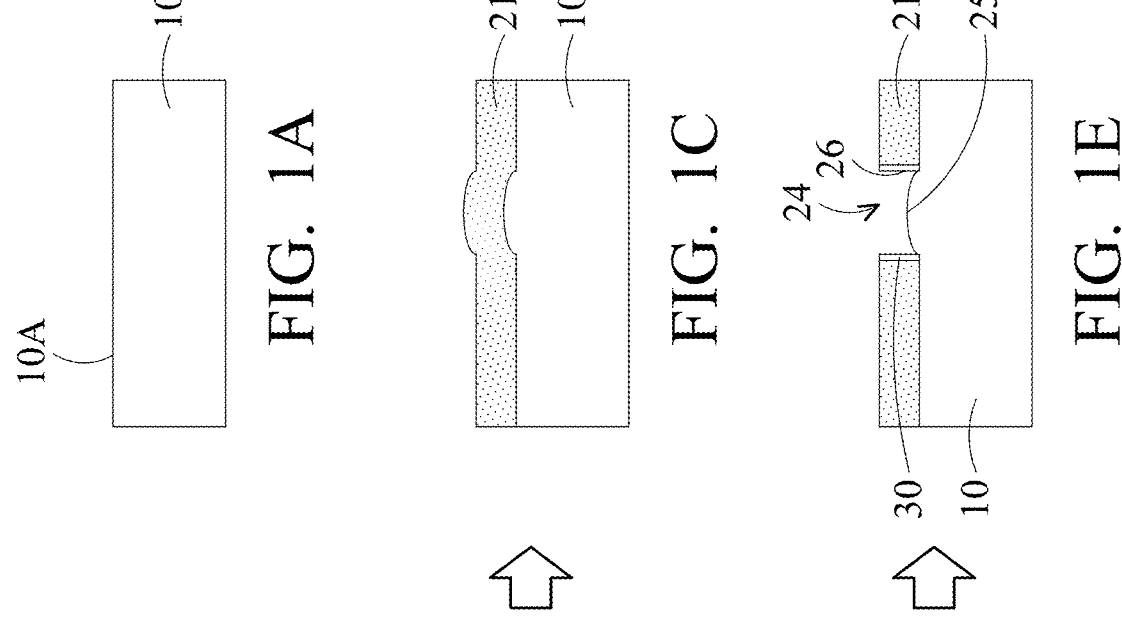
10
10A
FIG. 1A
21
10
FIG. 1C
21
25
26
24
30
10
FIG. 1E

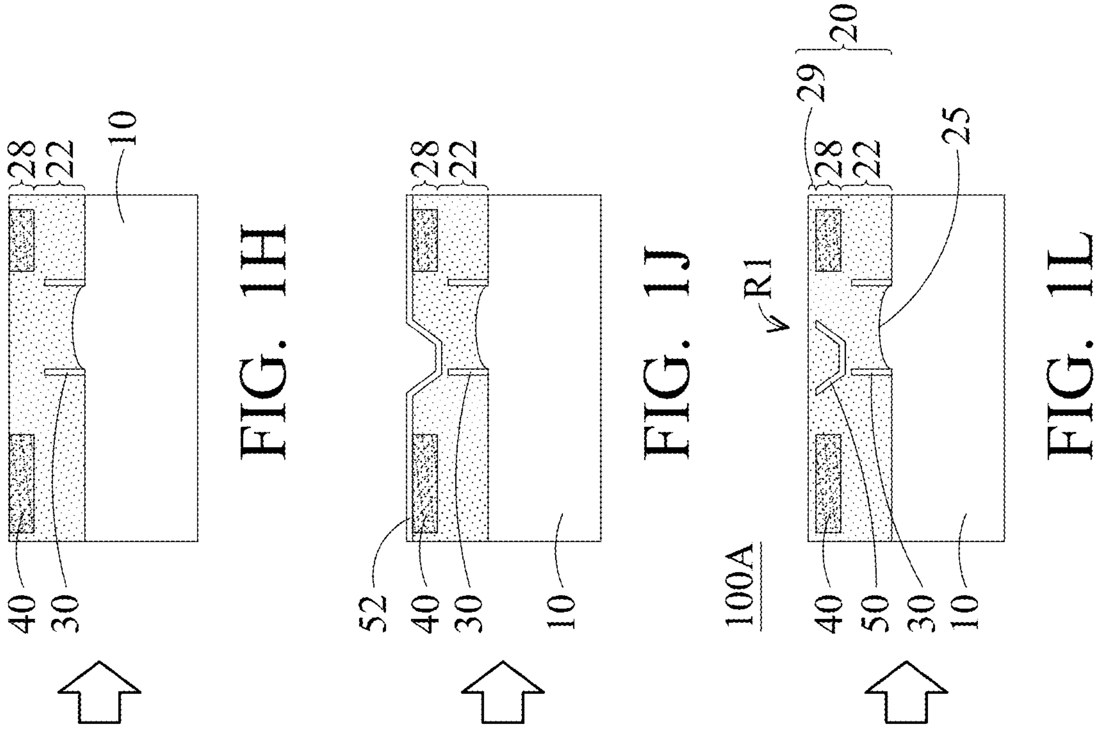
28
22
10
40
30
FIG. 1H
52
FIG. 1J
20
29
25
R1
100A
50
FIG. 1L
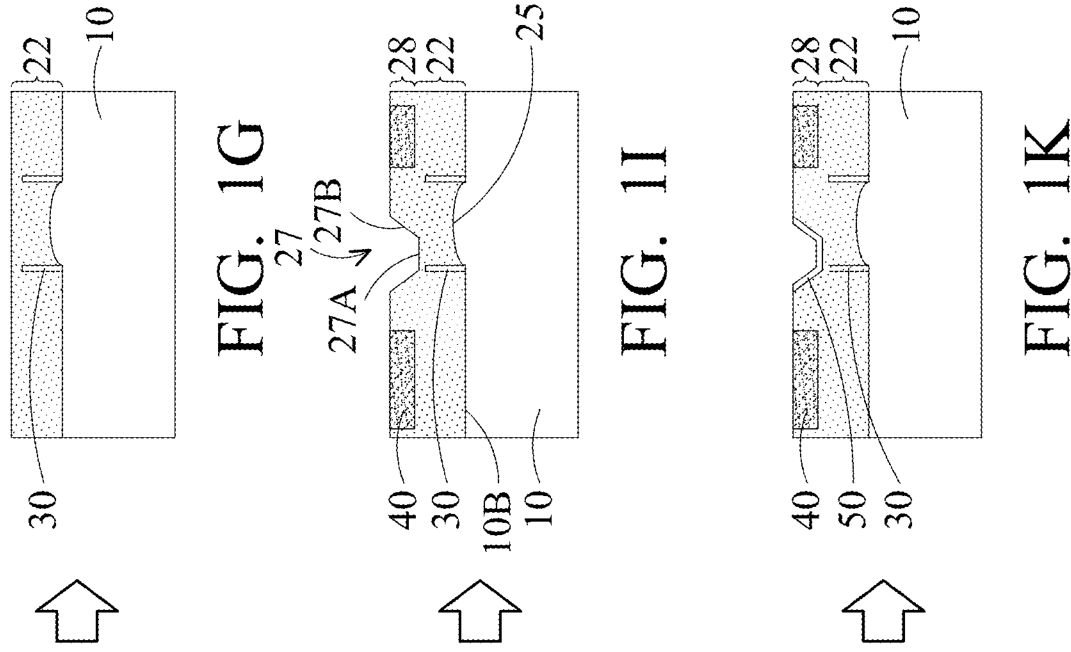
22
10
30
FIG. 1G
28
25
27
27B
27A
40
10B
FIG. 1I
50
FIG. 1K

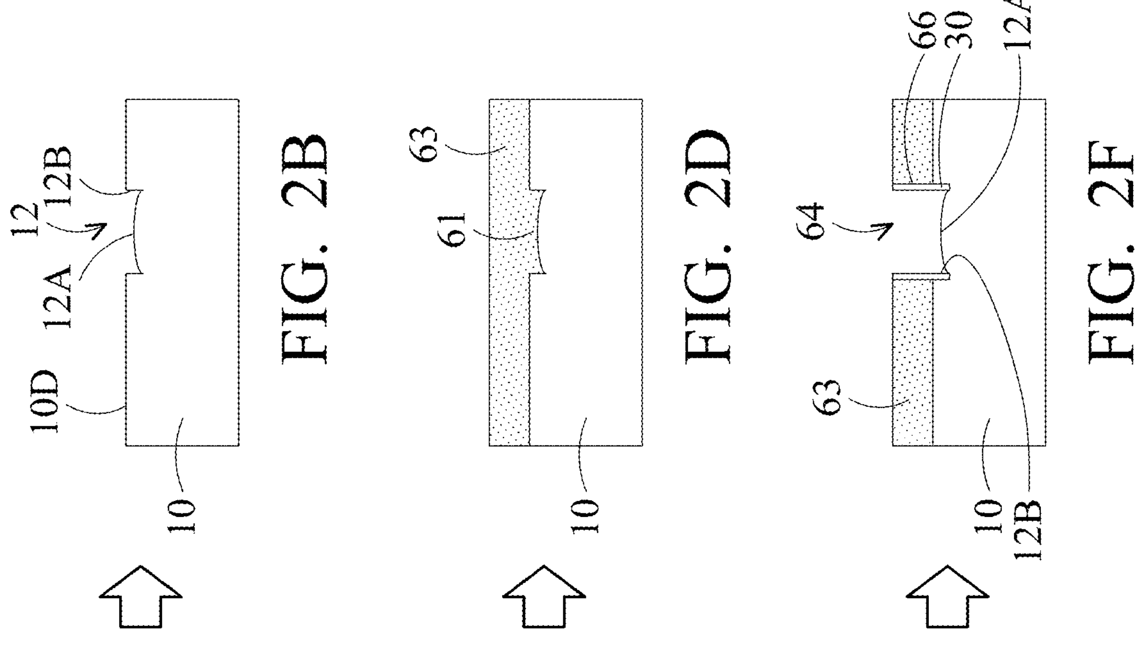
FIG. 2B
FIG. 2D
FIG. 2F
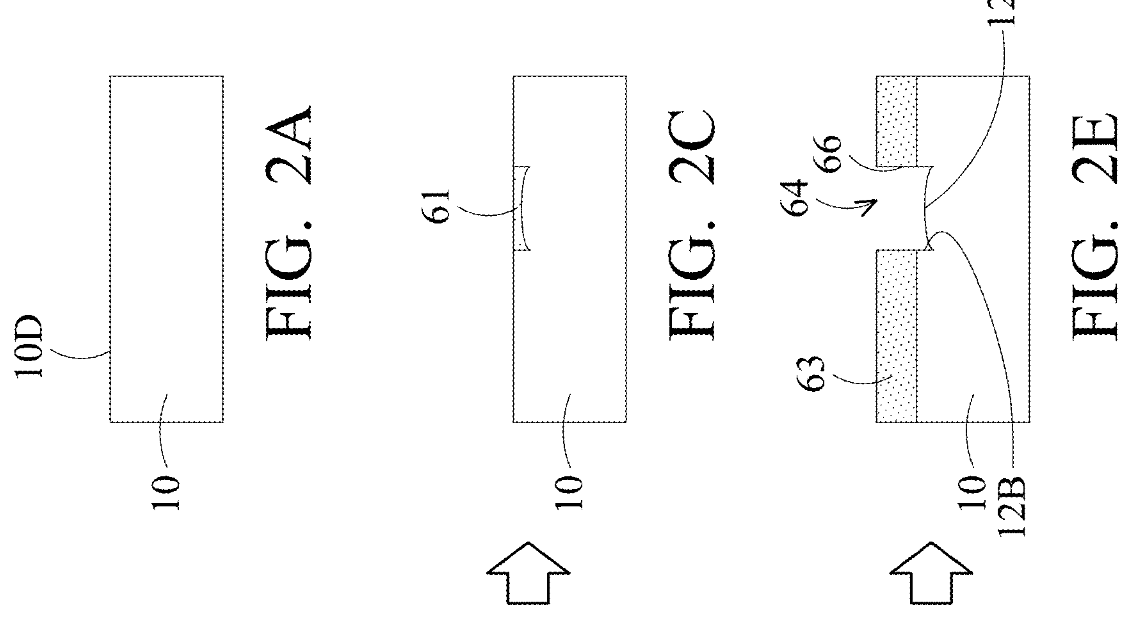
FIG. 2A
FIG. 2C
FIG. 2E

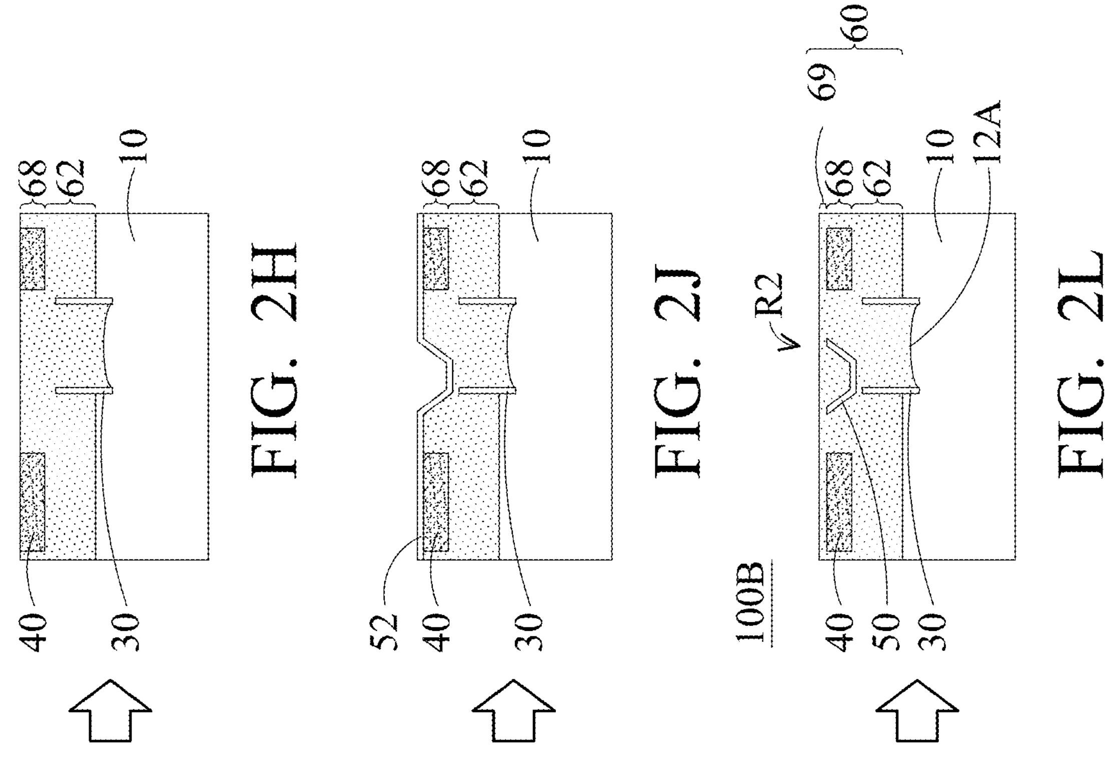
FIG. 2H
FIG. 2J
FIG. 2L
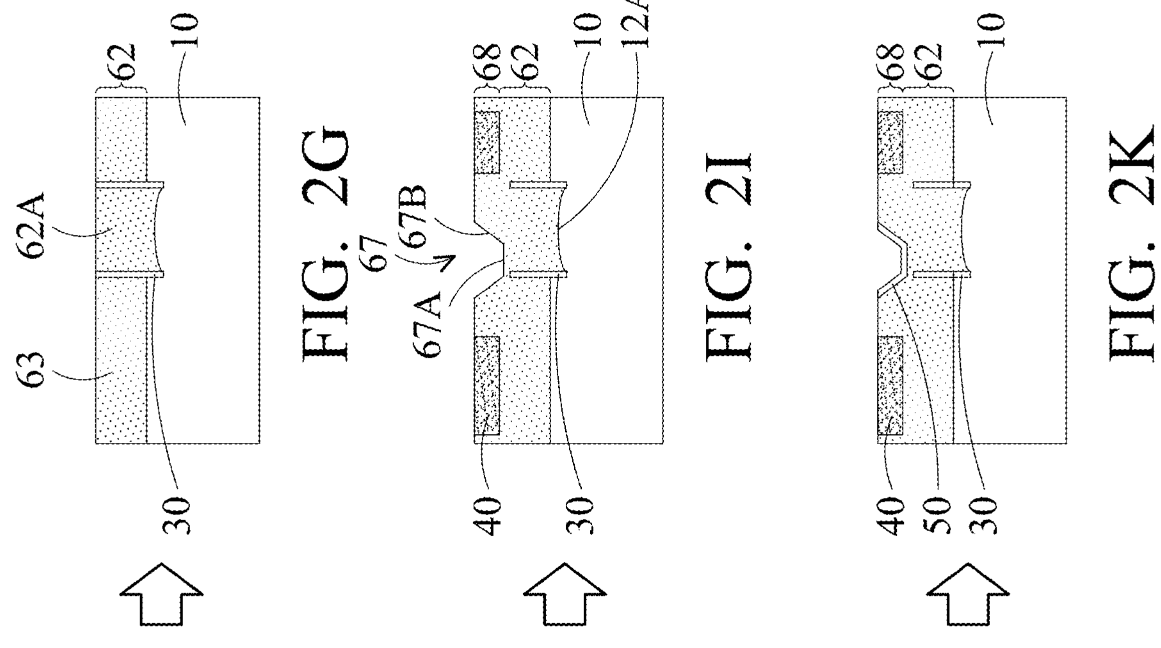
FIG. 2G
FIG. 2I
FIG. 2K 200A
300
A
350
230
360
100A
50
252
260

SEMICONDUCTOR PACKAGE AND METHOD FOR FORMING THE SAME

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers over a semiconductor substrate, and patterning the various material layers using lithography and etching processes to form circuit components and elements thereon. Many integrated circuits (ICs) are typically manufactured on a single semiconductor wafer, and individual dies on the wafer are singulated by sawing between the integrated circuits along a scribe line. The individual dies are typically packaged separately, in multi-chip modules, for example, or in other types of packaging.

Although existing package structures and methods of fabricating package structures have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1A to FIG. 1L are schematic views of a method of forming an optical bridge, in accordance with some embodiments of the present disclosure.

FIG. 2A to FIG. 2L are schematic views of a method of forming an optical bridge, in accordance with some embodiments of the present disclosure.

DETAILED DESCRIPTION

Figure 3A:
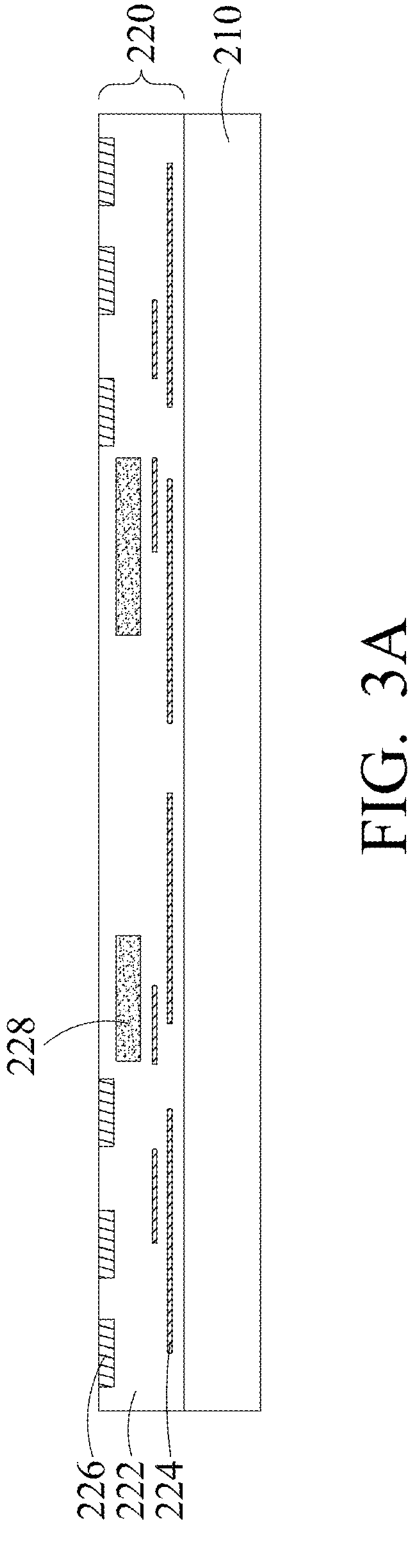
FIG. 3A to FIG. 3E are schematic views of forming a semiconductor package, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Use of ordinal terms such as “first”, “second”, etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

The terms “about” and “substantially” typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of “about” or “substantially”.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The present disclose provides a semiconductor package having an optical interposer die being as an optical bridge for intra- and inter-package communication, in accordance with some embodiments of the present disclosure. The optical interposer die can alleviate the photonic die area constraints and reduce costs. In addition, the optical interposer die does not have any active elements, which enables it to be manufactured at higher temperatures and achieve better performance.

FIG. 1A to FIG. 1L are schematic views of a method of forming an optical bridge 100A, in accordance with some embodiments of the present disclosure. As shown in FIG. 1A, a substrate 10 having a surface 10A is provided, in accordance with some embodiments. In some embodiments, the substrate 10 may be referred to as an optical interposer die 10. In some embodiments, the substrate 10 may be a semiconductor wafer such as a silicon wafer. Alternatively or additionally, the substrate 10 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP. In some embodiments, conductive features (e.g. conductive wires, pads, vias) may be disposed in the substrate 10.

In FIG. 1B, recessing the substrate 10 until a new surface 10B and a protrusion 10C protruding from the surface 10B are formed, in accordance with some embodiments of the present disclosure. In some embodiments, the recessing process may include lithography and etching processes. In some embodiments, the top surface of the protrusion 10C is a curved surface, which can serve as a curved surface for a lens mirror.

In FIG. 1C, forming a oxide layer 21 on the substrate 10 to cover the surface 10B and the protrusion 10C, in accordance with some embodiments of the present disclosure. In some embodiments, the oxide layer 21 may be, for example, a silicon oxide or the like.

In FIG. 1D, recessing the oxide layer 21 to form an opening 24 in the oxide layer 21. In some embodiments, the recessing process may include lithography and etching processes. In some embodiments, the opening 24 has a bottom surface 25 and sidewalls 26. In some embodiments, the oxide layer 21 is recessed to expose the underneath protrusion 10C, and the bottom surface 25 is a top surface of the protrusion 10C.

Afterwards, in FIG. 1E, forming an anti-reflection layer 30 on the sidewalls 26, in accordance with some embodiments of the present disclosure. In some embodiments, the bottom surface 25 is spaced apart from the anti-reflection layer 30.

In some embodiments, the material of the anti-reflection layer 30 may include silicon oxide, silicon nitride, polymer, benzocyclobutene (BCB), or any suitable material, in some embodiments of the present disclosure. The anti-reflection layer 30 can reduce optical loss or reflections. Methods of forming the anti-reflection layer 30 include physical vapor deposition (PVD) processes, such as evaporation, RF or DC sputtering; chemical vapor deposition (CVD) processes such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition; and/or any other suitable method known in the art.

In FIG. 1F, forming an oxide layer 23 on the oxide layer 21 and in the opening 24, in accordance with some embodiments of the present disclosure. In some embodiments, the oxide layer 23 may be, for example, a silicon oxide or the like. In some embodiments, the oxide layer 21 and the oxide layer 23 may have an identical material.

Next, in FIG. 1G, a planarization process is performed to remove the oxide layer 23 and a portion of the oxide layer 21 to form an oxide layer 22. In some embodiments, the anti-reflection layer 30 is exposed from the oxide layer 22. In some embodiments, the planarization process may include a chemical mechanical polish (CMP), a mechanical grinding process, an etch-back process, combinations thereof, or the like.

In FIG. 1H, an oxide layer 28 is formed on the oxide layer 22. In some embodiments, the oxide layer 28 may be, for example, a silicon oxide or the like. In some embodiments, a first waveguide 40 may be formed in the oxide layer 28. In some embodiments, the first waveguide 40 may be formed by forming a semiconductor material layer on the oxide layer 28, and then patterning the semiconductor material layer to form the first waveguide 40. In some embodiments, the first waveguide 40 is functioned as an optical transmitter or an optical receiver.

In some embodiments, the first waveguide 40 includes an elemental semiconductor material, a compound semiconductor material, or a semiconductor alloy. For instance, the elemental semiconductor may include Si or Ge. The compound semiconductor and the semiconductor alloy may respectively include SiGe, SiC, SiGeC, a III-V semiconductor or a II-VI semiconductor. For instance, the III-V semiconductor includes GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs or InAlPAs. The II-VI semiconductor may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe or HgZnSTe.

Next, as shown in FIG. 1I, recessing the oxide layer 28 to form a recess 27, in accordance with some embodiments. In some embodiments, the recess 27 has a first surface 27A and a second surface 27B. In some embodiments, the first surface 27A and the second surface 27B have different normal vectors. For example, the first surface 27A may be substantially parallel to the surface 10B, and the second surface 27B and the surface 10B may have an angle of about 45 degrees, in accordance with some embodiments of the present disclosure. In some embodiments, the anti-reflection layer 30 at least partially overlaps the recess 27 in a direction perpendicular to the surface 10B. In some embodiments, the first surface 27A and second surface 27B at least partially overlaps the bottom surface 25 in the direction perpendicular to the surface 10B. In some embodiments, the recessing process may include lithography and etching processes.

Subsequently, as shown in FIG. 1J, a high reflection coating (HRC) 52 is disposed on the oxide layer 28 and in the recess 27 to cover the first surface 27A and the second surface 27B. In some embodiments, the high reflection coating 52 may comprise one or more layers of a material such as a metal (e.g., copper or the like), titanium nitride, the like, or combinations thereof. In some embodiments, the high reflection coating 52 may comprise a periodic stack of dielectric layers, such as a stack comprising layers of silicon oxide, silicon nitride, or the like.

In FIG. 1K, a planarization process is performed to remove the high reflection coating 52 outside the recess 27, and the high reflection coating 52 in the recess is preserved as a reflective element 50, in accordance with some embodiments. In some embodiments, the planarization process may include a chemical mechanical polish (CMP), a mechanical grinding process, an etch-back process, combinations thereof, or the like. In some embodiments, the reflective element 50 may be a mirror coated with high-refractive material, and the high-refractive material may include, for example, metal (e.g., copper or the like), titanium nitride, the like, or combinations thereof. In some embodiments, the mirror is arranged with the bottom surface 25 in a direction perpendicular to the substrate 10, such as perpendicular to the surface 10A.

Thereafter, as shown in FIG. 1L, an oxide layer 29 is formed on the oxide layer 28 to form the optical bridge 100A. In some embodiments, the oxide layer 29 may be, for example, a silicon oxide or the like. In some embodiments, the oxide layer 22, the oxide layer 28, and the oxide layer 29 may include an identical material. In some embodiments, the oxide layer 22, the oxide layer 28, and the oxide layer 29 may be collectively referred to as an oxide layer 20. In some embodiments, the oxide layer 20, the anti-reflection layer 30, the first waveguide 40, and the reflective element 50 may be referred to as a first photonic routing structure R1, in according with some embodiments of the present disclosure.

FIG. 2A to FIG. 2L are schematic views of a method of forming an optical bridge 100B, in accordance with some embodiments of the present disclosure. As shown in FIG. 2A, a substrate 10 is provided, in accordance with some embodiments. In some embodiments, the substrate 10 may be referred to as an optical interposer die 10. In some embodiments, the substrate 10 may be a semiconductor wafer such as a silicon wafer. Alternatively or additionally, the substrate 10 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

As shown in FIG. 2B, a recess 12 is formed on the surface 10D of the substrate 10. In some embodiments, the recess 12 may have a bottom surface 12A and sidewalls 12B. In some embodiments, the bottom surface 12A is a curved surface, which can serve as a curved surface for a lens mirror. In some embodiments, processes to form the recess 12 may include lithography and etching process.

Next, in FIG. 2C, an oxide layer 61 is formed in the recess 12. In some embodiments, the oxide layer 61 may be, for example, a silicon oxide or the like. In some embodiments, the oxide layer 61 may be formed by depositing an oxide layer on the substrate 10, and then performing a planarization process to remove redundant materials outside the recess 12. In some embodiments, the planarization process may include a chemical mechanical polish (CMP), a mechanical grinding process, an etch-back process, combinations thereof, or the like.

Subsequently, as shown in FIG. 2D, an oxide layer 63 is disposed on the substrate 10. In some embodiments, the oxide layer 63 may be, for example, a silicon oxide or the like. Afterwards, in FIG. 2E, an opening 64 is formed in the oxide layer 63 and the recess 12 to expose the bottom surface 12A and the sidewalls 12B of the recess 12, and the oxide layer 61 is removed when forming the opening 64, in accordance with some embodiments. In some embodiments, processes for forming the opening 64 may include lithography and etching processes. In some embodiments, the opening 64 has sidewalls 66, and the sidewalls 12B and the sidewalls 66 continuously extend.

Next, as shown in FIG. 2F, forming an anti-reflection layer 30 on the sidewalls 12B and the sidewalls 66, in accordance with some embodiments of the present disclosure. In some embodiments, the material of the anti-reflection layer 30 may include silicon oxide, silicon nitride, polymer, BCB, or any suitable material, in some embodiments of the present disclosure. The anti-reflection layer 30 can reduce optical loss or reflections. Methods of forming the anti-reflection layer 30 include physical vapor deposition (PVD) processes, such as evaporation, RF or DC sputtering; chemical vapor deposition (CVD) processes such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition; and/or any other suitable method known in the art.

Next, in FIG. 2G, forming an oxide material 62A in the opening 64, and the oxide material 62A and the oxide layer 63 may be collectively referred to as an oxide layer 62. In some embodiments, forming the oxide material 62A in the opening 64 includes depositing an oxide material covering the oxide layer 63 and in the opening 64, and then performing a planarization process to remove the oxide material above the oxide layer 63 and outside the opening 64. In some embodiments, the planarization process may include a chemical mechanical polish (CMP), a mechanical grinding process, an etch-back process, combinations thereof, or the like.

In FIG. 2H, an oxide layer 68 is formed on the oxide layer 62. In some embodiments, the oxide layer 68 may be, for example, a silicon oxide or the like. In some embodiments, a first waveguide 40 may be formed in the oxide layer 68. In some embodiments, the first waveguide 40 may be formed by forming a semiconductor material layer on the oxide layer 68, and then patterning the semiconductor material layer to form the first waveguide 40. In some embodiments, the first waveguide 40 is functioned as an optical transmitter or an optical receiver.

Next, as shown in FIG. 2I, recessing the oxide layer 68 to form a recess 67, in accordance with some embodiments. In some embodiments, the recess 67 has a first surface 67A and a second surface 67B. In some embodiments, the first surface 67A and the second surface 67B have different normal vectors. For example, the first surface 67A may be substantially parallel to the surface 10D, and the second surface 67B and the surface 10D may have an angle of about 45 degrees, in accordance with some embodiments of the present disclosure. In some embodiments, the anti-reflection layer 30 at least partially overlaps the recess 67 in a direction perpendicular to the surface 10D. In some embodiments, the first surface 67A and second surface 67B at least partially overlaps the bottom surface 12A in the direction perpendicular to the surface 10D. In some embodiments, the recessing process may include lithography and etching processes.

Subsequently, as shown in FIG. 2J, a high reflection coating (HRC) 52 is disposed on the oxide layer 68 and in the recess 67 to cover the first surface 67A and the second surface 67B. In some embodiments, the high reflection coating 52 may comprise one or more layers of a material such as a metal (e.g., copper or the like), titanium nitride, the like, or combinations thereof. In some embodiments, the high reflection coating 52 may comprise a periodic stack of dielectric layers, such as a stack comprising layers of silicon oxide, silicon nitride, or the like.

In FIG. 2K, a planarization process is performed to remove the high reflection coating 52 outside the recess 67, and the high reflection coating 52 in the recess is preserved as a reflective element 50, in accordance with some embodiments. In some embodiments, the planarization process may include a chemical mechanical polish (CMP), a mechanical grinding process, an etch-back process, combinations thereof, or the like. In some embodiments, the reflective element 50 may be a mirror coated with high-refractive material, and the high-refractive material may include, for example, metal (e.g., copper or the like), titanium nitride, the like, or combinations thereof. In some embodiments, the mirror is arranged with the bottom surface 12A in a direction perpendicular to the substrate 10, such as perpendicular to the surface 10D.

Thereafter, as shown in FIG. 2L, an oxide layer 69 is formed on the oxide layer 68 to form the optical bridge 100B. In some embodiments, the oxide layer 69 may be, for example, a silicon oxide or the like. In some embodiments, the oxide layer 62, the oxide layer 68, and the oxide layer 69 may include an identical material. In some embodiments, the oxide layer 62, the oxide layer 68, and the oxide layer 69 may be collectively referred to as an oxide layer 60. In some embodiments, the oxide layer 60, the anti-reflection layer 30, the first waveguide 40, and the reflective element 50 may be referred to as a first photonic routing structure R2, in according with some embodiments of the present disclosure.

In some embodiments, the optical bridge 100A or the optical bridge 100B may allow light to pass through for adjusting optical path of external optical signal. For instance, light can pass through the bottom surface 12A or the bottom surface 25 and reach the reflective element 50. The reflective element 50 then reflects the light, altering its direction, allowing it to be transmitted to the waveguide 40. The waveguide 40 can then deliver the light to other elements, which will be described later.

FIG. 3A to FIG. 3E are schematic views of forming a semiconductor package 200A, in accordance with some embodiments of the present disclosure. As shown in FIG. 3A, a redistribution structure 220 is formed on a substrate 210. In some embodiments, the substrate 210 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the redistribution structure 220 includes multiple insulating layers 222, and conductive features 224, conductive features 226, and a third waveguide 228 surrounded by the insulating layers 222. The conductive features 224 may include conductive lines and/or conductive vias. The conductive features 226 may include conductive pads. In some embodiments, some of the conductive vias are stacked with each other. The upper conductive via is substantially aligned with the lower conductive via. In some embodiments, some of the conductive vias are staggered vias. The upper conductive via is misaligned with the lower conductive via. In some embodiments, the insulating layers 222 may be made of or include a polymer material, a ceramic material, a metal material, a semiconductor material, one or more other suitable materials, or a combination thereof. In some embodiments, the conductive features 224 and 226 may be made of or include copper, aluminum, cobalt, nickel, gold, silver, tungsten, one or more other suitable materials, or a combination thereof.

In some embodiments, the third waveguide 228 may be formed by forming a semiconductor material layer and then patterning the semiconductor material layer. In some embodiments, the third waveguide 228 is functioned as an optical transmitter or an optical receiver.

Figure 3B:
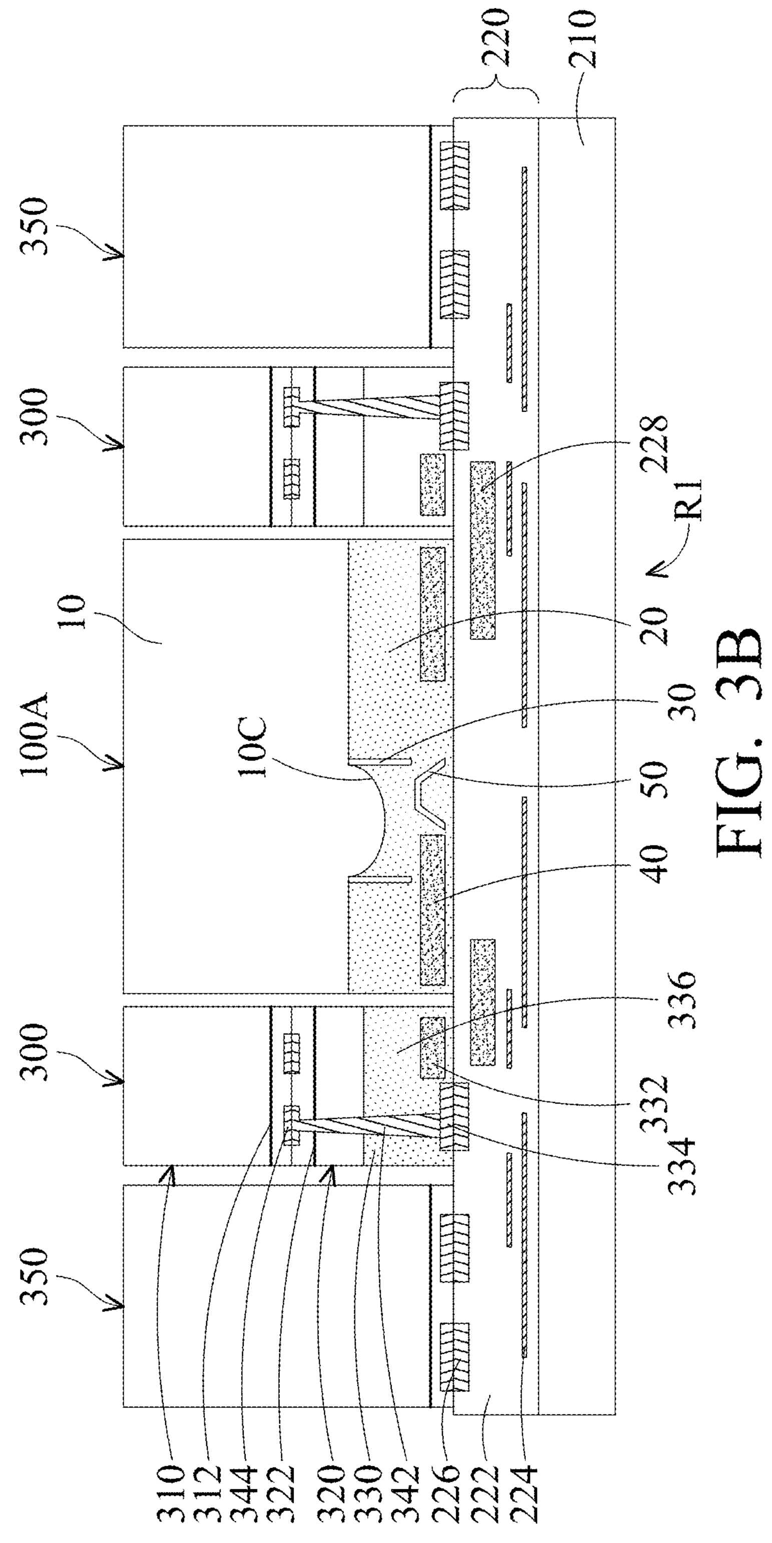

Next, in FIG. 3B, the optical bridge 100A, optical engine dies 300, and dies 350 may be disposed on the redistribution structure 220, in accordance with some embodiments of the present disclosure. In some embodiments, the optical bridge 100A may be alternatively replaced by the optical bridge 100B described above as well.

In some embodiments, the optical engine die 300 includes an electric die 310, a photonic die 320, and the optical engine die 300 is disposed on a second photonic routing structure 330. In some embodiments, the second photonic routing structure 330 is disposed on the redistribution structure 220, the photonic die 320 is disposed on the second photonic routing structure 330, and the photonic die 320 is disposed on the electric die 310. In some embodiments, the redistribution structure 220 is electrically connected to the second photonic routing structure 330 by the conductive features 226 disposed in the redistribution structure 220 and conductive features 334 disposed in a oxide layer 336, and then electrically connected to the electric die 310 by a conductive via 342 penetrating the oxide layer 336 and the redistribution structure 220 to conductive features 344 between the electric die 310 and the photonic die 320. In some embodiments, the oxide layer 336 may be, for example, a silicon oxide or the like. In some embodiments, a second waveguide 332 is disposed in the oxide layer 336. In some embodiments, the second waveguide 332 may be formed by forming a semiconductor material layer and then patterning the semiconductor material layer. In some embodiments, the second waveguide 332 is functioned as an optical transmitter or an optical receiver. In some embodiments, the conductive features 334, the conductive via 342, and the conductive features 344 may be made of or include copper, aluminum, cobalt, nickel, gold, silver, tungsten, one or more other suitable materials, or a combination thereof.

In some embodiments, the electric die 310 may be an electronic integrated circuit (EIC) or the like that provides Serializer/Deserializer (SerDes) functionality, and has a device layer 312 including elements for performing these functions. In this manner, the electric die 310 may act as part of an I/O interface between optical signals and electrical signals within the semiconductor package 200A.

In some embodiments, the photonic die 320 is configured to process, receive, and/or transmit optical signals. The photonic die 320 is thus also being referred to as an optical chip in some applications. Optical signals are electromagnetic signals exhibiting a characteristic capable of being modeled by photons and are different from electrical signals which are signals carried by electrical charges, such as electrons, holes, or ions. In alternative embodiments, the photonic die 320 further includes one or more active and/or passive components disposed in a device layer 322 therein and configured to process, receive and/or transmit electrical signals converted to/from optical signals by the laser die. In alternative embodiments, the PIC 130 further includes light detecting devices such as photo-sensors disposed in the device layer 322.

In some embodiments, the dies 350 are electrically connected to the redistribution structure 220. In some embodiments, the dies 350 are logic dies (e.g., central processing units (CPUs), graphics processing units (GPUs), system-on-chips (SoCs), application processors (APs), microcontrollers, application-specific integrated circuit (ASIC) dies, or the like), memory dies (e.g., dynamic random access memory (DRAM) dies, static random access memory (SRAM) dies, high bandwidth memory (HBM) dies, or the like), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies or the like), front-end dies (e.g., analog front-end (AFE) dies), the like, or a combination thereof.

In some embodiments, the optical bridge 100A and the optical engine dies 300 are arranged in a direction parallel to the surface of the substrate 210. For example, the electric die 310 and the photonic die 320 are arranged with the substrate 10 in the direction parallel to the surface of the substrate 210.

Figure 3C:
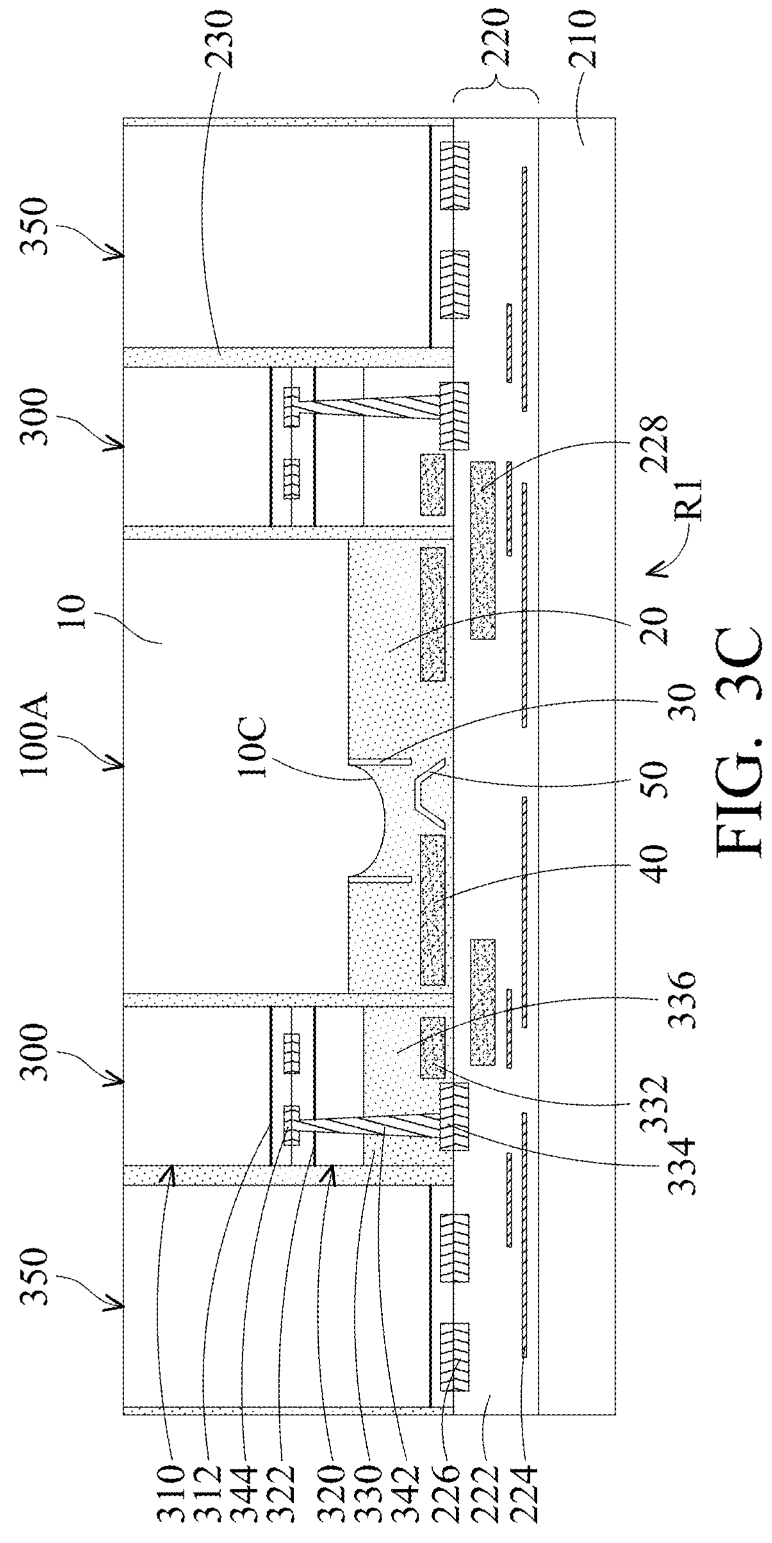

Afterwards, in FIG. 3C, a molding structure 230 is formed to surround the optical bridge 100A, the optical engine dies 300, and the dies 350, in accordance with some embodiments of the present disclosure. In some embodiments, the first photonic routing structure R1 and the second photonic routing structure 330 are separated by the molding structure 230. In some embodiments, the molding structure 230 may be formed from a suitably transparent material such as silicon oxide instead of an opaque material such as a molding compound. The use of a suitably transparent material for the molding structure 230 in this manner allows optical signals to be transmitted through the molding structure 230. After the molding structure 230 is formed to surround the optical bridge 100A, the optical engine dies 300, and the dies 350, a planarization process may be performed to expose the optical bridge 100A, the optical engine dies 300, and the dies 350, in accordance with some embodiments of the present disclosure.

Figure 3D:
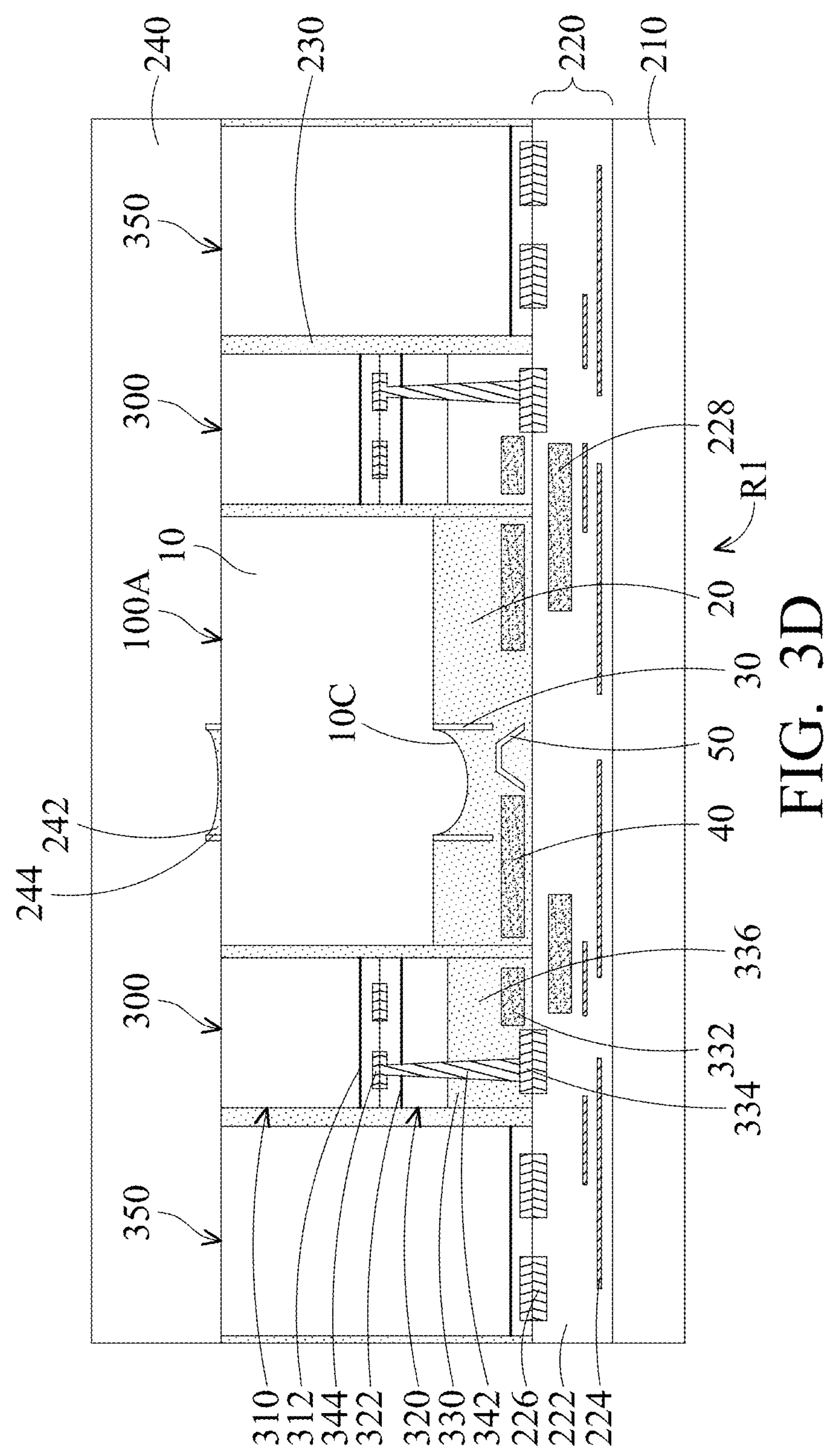

As shown in FIG. 3D, a support substrate 240 is disposed on the optical bridge 100A, the optical engine dies 300, and the dies 350, in accordance with some embodiments of the present disclosure. In some embodiments, a dielectric structure 242 and an anti-reflection layer 244 are formed in the support substrate 240. In some embodiments, the dielectric structure 242 may have a curved surface, which can serve as a curved surface for a lens mirror. In some embodiments, the dielectric structure 242 and the protrusion 10C may arrange in the direction perpendicular to the substrate 210, so that light may pass through this direction.

In some embodiments, the support substrate 240 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP. In some embodiments, the dielectric structure 242 may include suitably transparent material such as silicon oxide. In some embodiments, the anti-reflection layer 244 may include silicon oxide, silicon nitride, polymer, benzocyclobutene (BCB), or any suitable material, in some embodiments of the present disclosure.

Figure 3E:
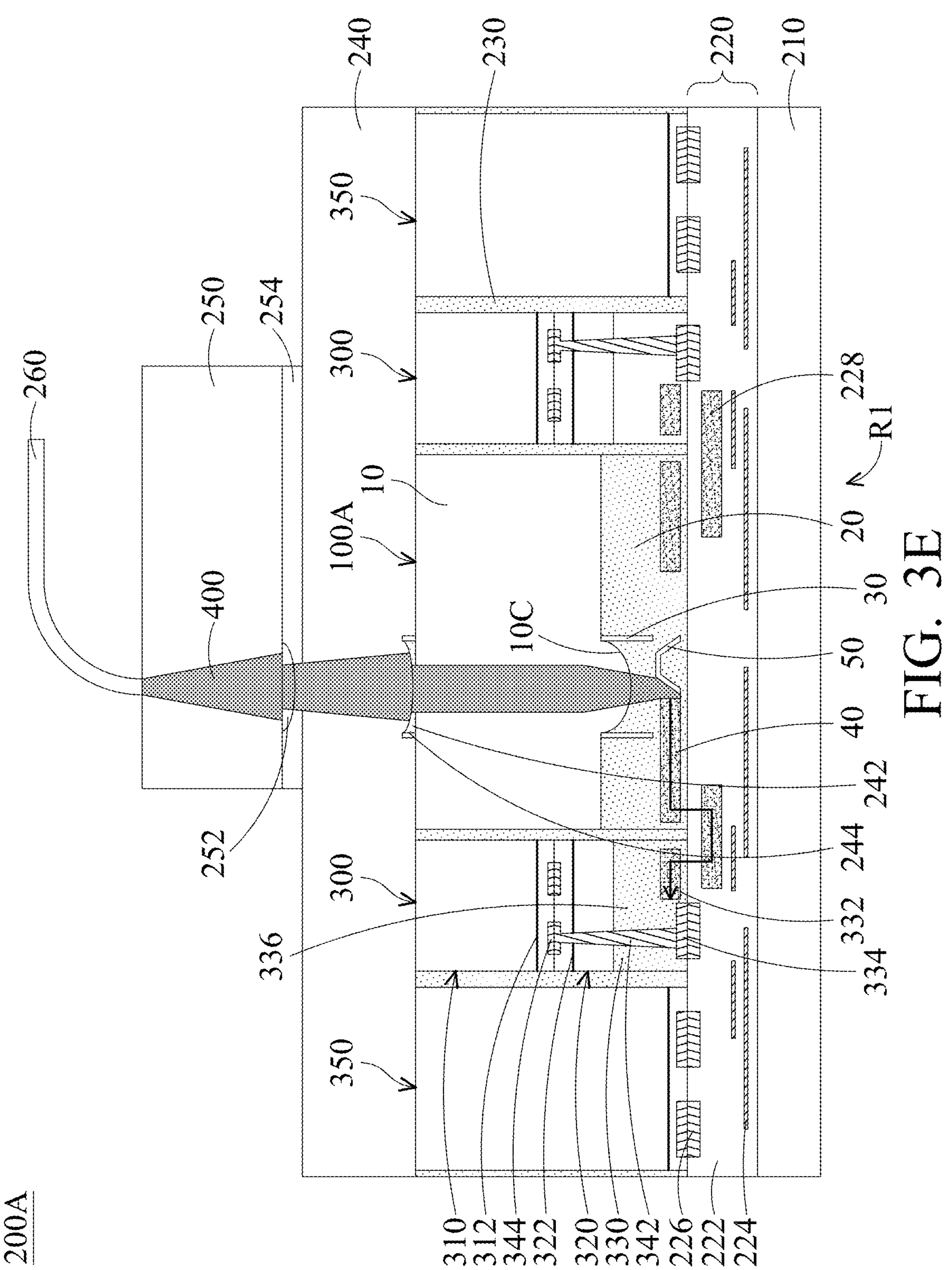

In FIG. 3E, a dielectric structure 250 is disposed on the support substrate 240, in accordance with some embodiments of the present disclosure. In some embodiments, a protrusion 252 is formed on a bottom surface of the dielectric structure 250, and a dielectric material 254 is disposed between the support substrate 240 and the dielectric structure 250 and surrounding the protrusion 252. An optical fiber 260 is connected to the dielectric structure 250, in accordance with some embodiments of the present disclosure.

In some embodiments, the dielectric structure 250 and may serve as a fiber array unit (FAU) 250 that allows optical fiber 260 to be connected to the semiconductor package 200A and allows light passing through. In some embodiments, the dielectric structure 250 may be a semiconductor wafer such as a silicon wafer. Alternatively or additionally, the dielectric structure 250 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP. In some embodiments, the protrusion 252 may have a curved bottom surface, which can serve as a curved surface for a lens mirror. The dielectric material 254 may be formed from a suitably transparent material such as silicon oxide, in accordance with some embodiments of the present disclosure.

In some embodiments, light 400 from the optical fiber 260 may penetrate the dielectric structure 250 and sequentially passing through the protrusion 252, the dielectric structure 242, and the protrusion 10C. After the light 400 reaches the reflective element 50, the direction of the light 400 may be changed to reach the first waveguide 40. In some embodiments, the protrusion 10C and the reflective element 50 are arranged in a direction different from a direction that the reflective element 50 and the first waveguide 40 arranged with each other. In some embodiments, the protrusion 10C and the reflective element 50 are arranged in a direction substantially perpendicular to the substrate 10, and the reflective element 50 and the first waveguide 40 are arranged in a direction substantially parallel to the substrate 10. In some embodiments, the first waveguide 40 partially overlaps the third waveguide 228, and the third waveguide 228 partially overlaps the second waveguide 332 in the direction perpendicular to the substrate 210, so the first waveguide 40 is optically coupled to the third waveguide 228, and the third waveguide 228 is optically coupled to the second waveguide 332. The light 400 then sequentially passes through the first waveguide 40, the third waveguide 228, and the second waveguide 332. The second waveguide 332 is optically coupled to the photonic die 320, so the light 400 may reach the photonic die 320 to allow external optical signal being transmitted into the semiconductor package 200A. Such interlayer transition increases the transition efficiency, and thus enhances the performance.

By using the optical bridge 100A as the optical path for the semiconductor package 200A, the size of the optical engine dies 300 may be reduced. Moreover, no active element is formed in the optical bridge 100A, so the optical bridge 100A can be processed in a relatively high temperature to increase the performance and yield of the semiconductor package 200A, and the process may be simplified. On the other hand, the optical engine dies 300 and the dies 350 having active elements will be prevented from being damaged by the high temperature process. For example, the protrusion 10C serves as a lens with high radius-of-curvature (ROC) to enhance the focus performance. In some embodiments, the pitch of the optical path may be reduced by providing the optical bridge 100A.

Figure 4:
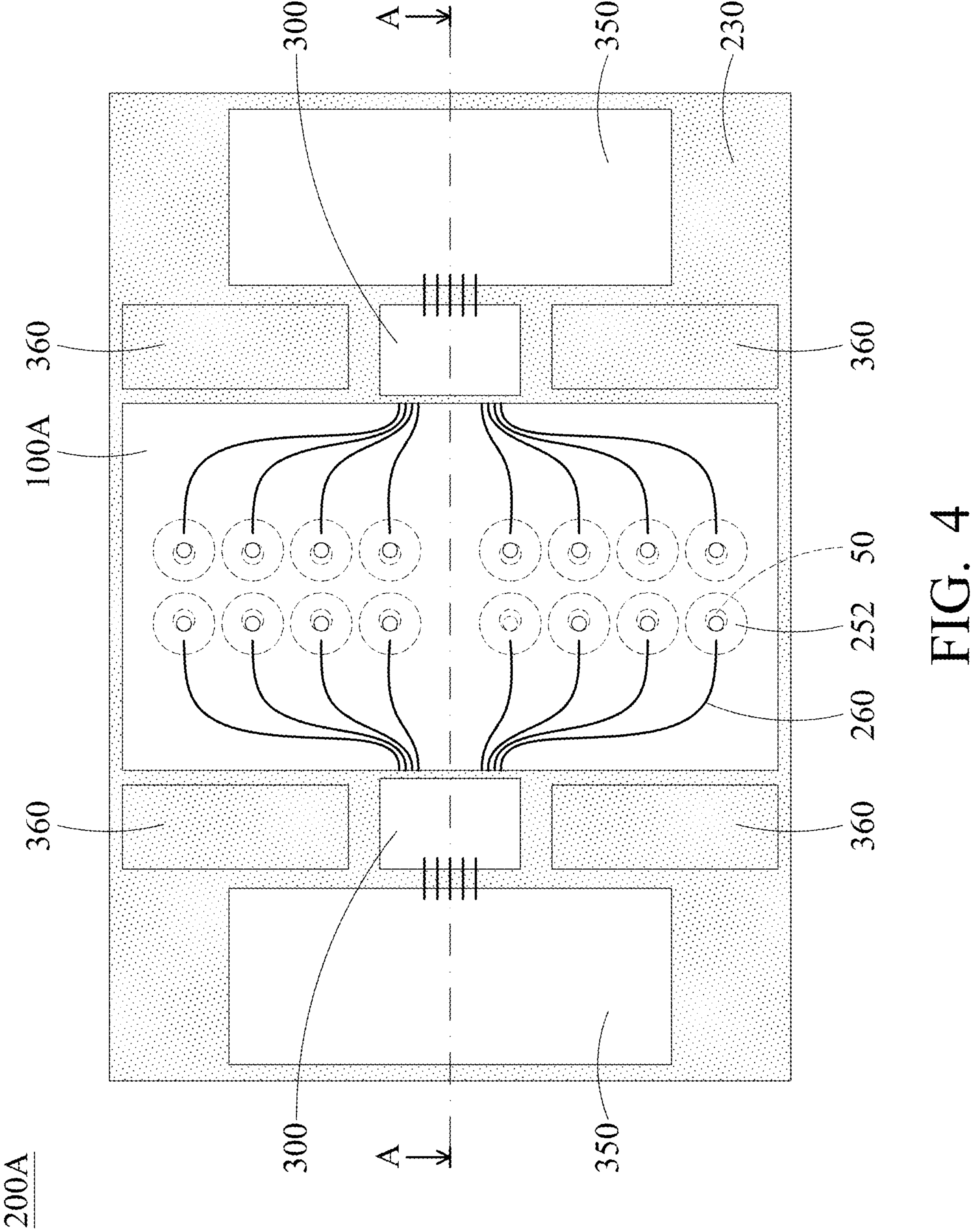
FIG. 4 is a top view of the semiconductor package, in accordance with some embodiments of the present disclosure.

FIG. 4 is a top view of the semiconductor package 200A, in accordance with some embodiments of the present disclosure. In some embodiments, FIG. 3A to FIG. 3E are cross-sectional views taken along a line A-A in FIG. 4. In some embodiments, the semiconductor package 200A further has some dummy dies 360 disposed on the redistribution structure 220 and surrounded by the molding structure 230 to balance the stress in the semiconductor package 200A. In some embodiments, the reflective element 50 overlaps the protrusion 252.

Figure 5:
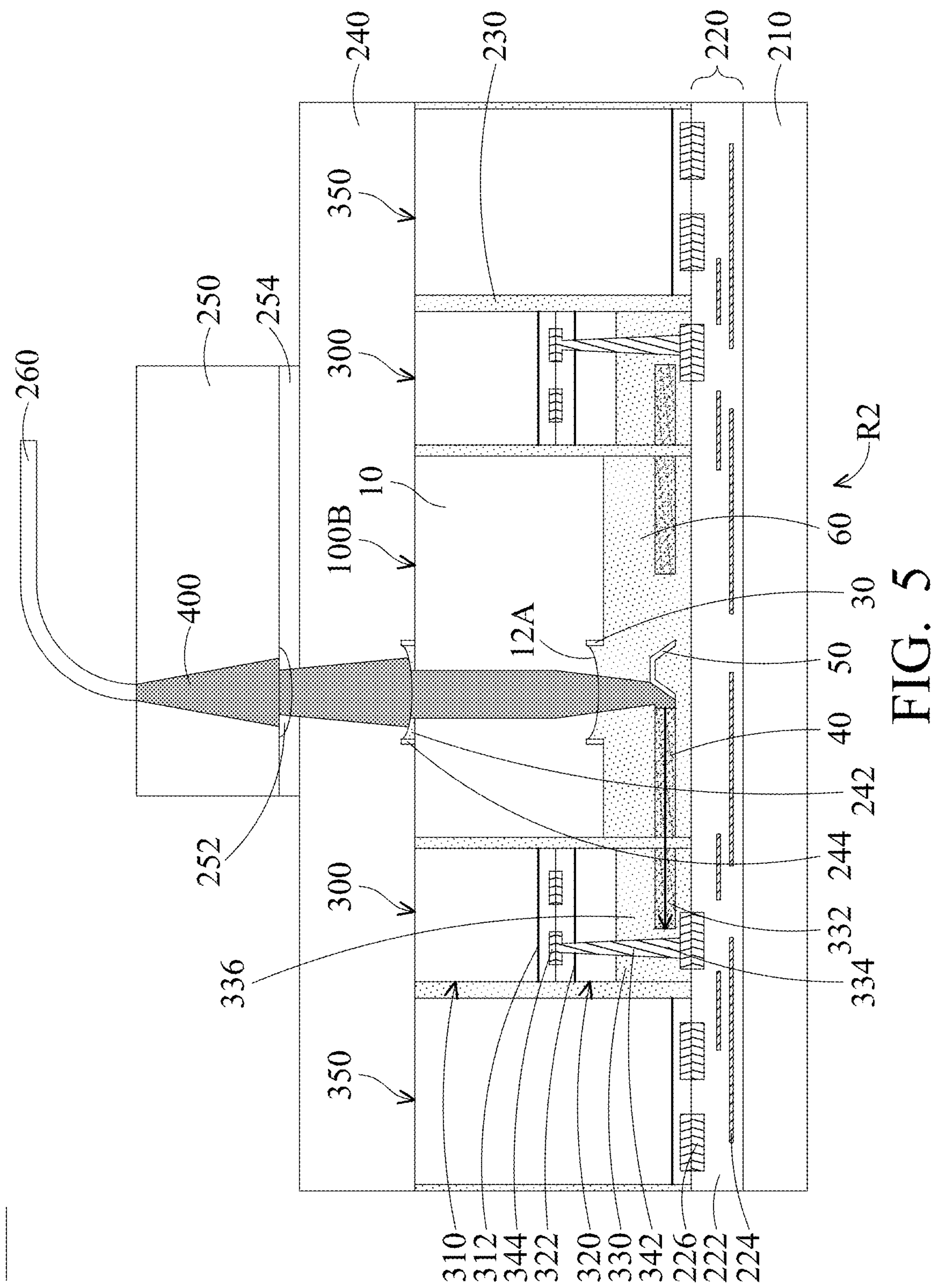
FIG. 5 is a schematic view of a semiconductor package, in accordance with some embodiments of the present disclosure.

FIG. 5 is a schematic view of a semiconductor package 200B, in accordance with some embodiments of the present disclosure. In some embodiments, the semiconductor package 200B may be similar to the semiconductor package 200A, and identical elements are not described again for simplicity. As shown in FIG. 5, the optical bridge 100A and the optical bridge 100B may be interchanged. In some embodiments, the third waveguide 228 may be omitted, and the light 400 may directly transmitted from the first waveguide 40 to the second waveguide 332 through the molding structure 230 by edge coupling. This configuration reduces the areal requirement of the waveguides and thus reduces the cost.

Figure 6:
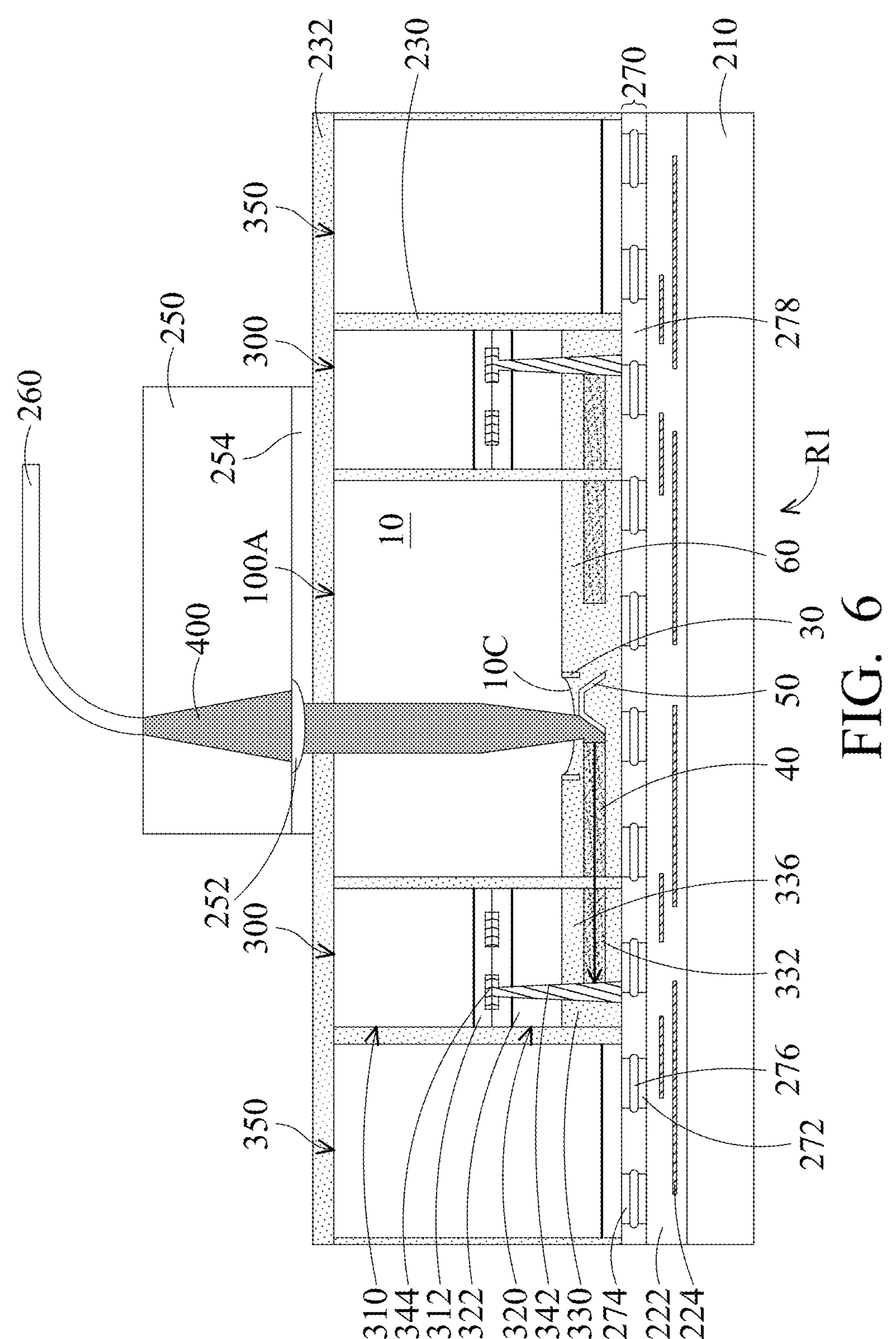
FIG. 6 is a schematic view of a semiconductor package, in accordance with some embodiments of the present disclosure.

FIG. 6 is a schematic view of a semiconductor package 200C, in accordance with some embodiments of the present disclosure. Identical elements are not described again for simplicity. As shown in FIG. 6, a bonding layer 270 may be provided, which includes conductive features 272, 274, and 276 disposed in a dielectric layer 278, in accordance with some embodiments. In some embodiments, the conductive features 272, 274 may be conductive pads, and the conductive feature 276 may include conductive bumps (such as tin-containing solder bumps) and/or conductive pillars (such as copper pillars). The dielectric layer 278 may be made of or include one or more polymer materials. The polymer material(s) may include polybenzoxazole (PBO), polyimide (PI), one or more other suitable polymer materials, or a combination thereof. In some embodiments, the polymer material is photosensitive. In some embodiments, some or all of the dielectric layers 108 are made of or include dielectric materials other than polymer materials. The dielectric material may include silicon oxide, silicon carbide, silicon nitride, silicon oxynitride, one or more other suitable materials, or a combination thereof. The presence of the bonding layer 270 reduces the cost of the semiconductor package 200C.

In some embodiments, a molding structure 232 may be provided to surround the optical bridge 100A, the optical engine dies 300, and the dies 350. In some embodiments, the molding structure 232 may include optical clean adhesive (OCA) or other transparent materials to allow light to pass through.

Figure 7:
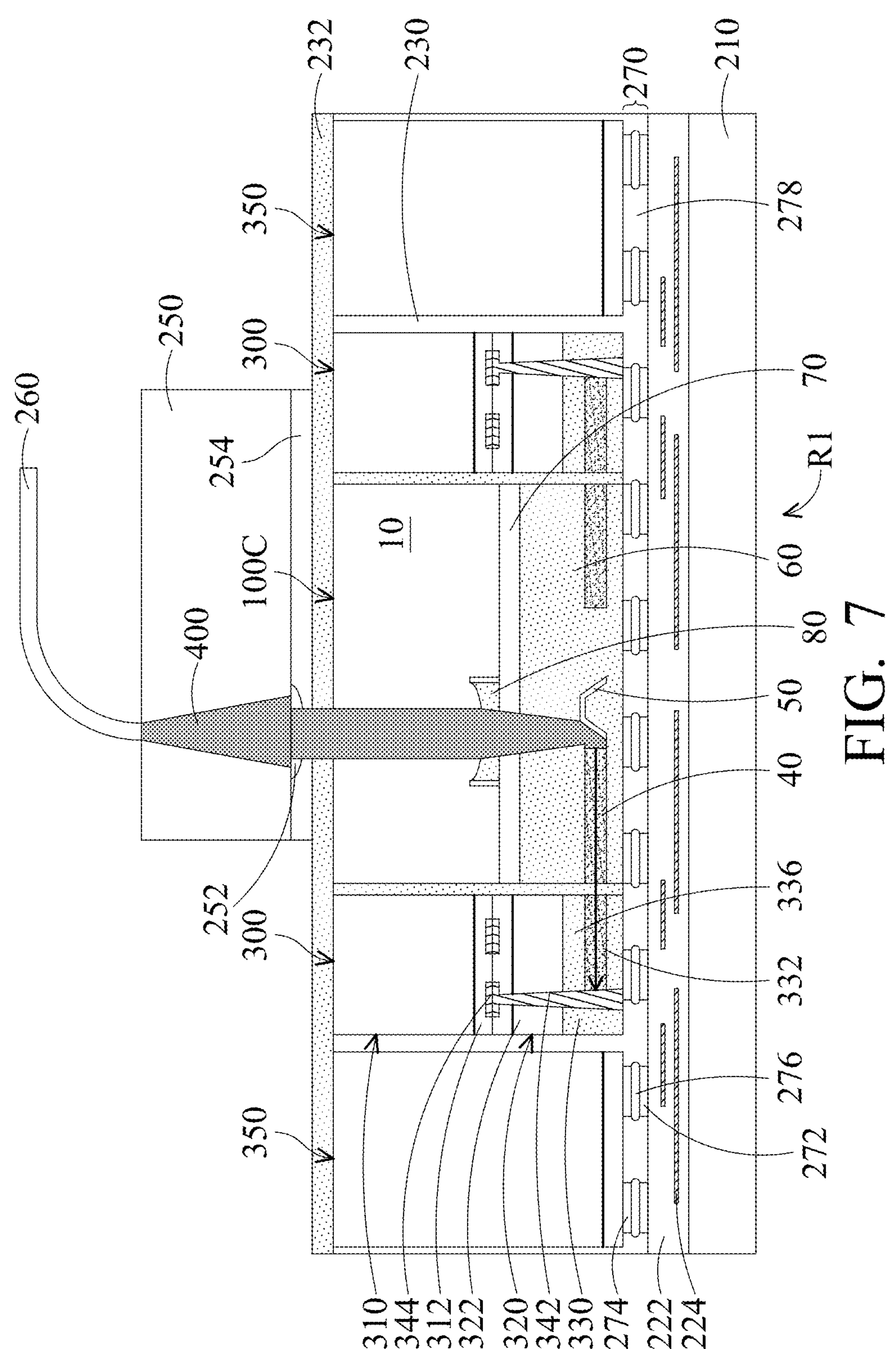
FIG. 7 is a schematic view of a semiconductor package, in accordance with some embodiments of the present disclosure.

FIG. 7 is a schematic view of a semiconductor package 200D, in accordance with some embodiments of the present disclosure. Identical elements are not described again for simplicity. In some embodiments, as shown in FIG. 7, the optical bridge 100C includes a dielectric layer 70 disposed between the substrate 10 and the oxide layer 60. In some embodiments, the dielectric layer 70 may be a semiconductor wafer such as a silicon wafer. Alternatively or additionally, the dielectric layer 70 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP. In some embodiments, the thickness of the dielectric layer 70 may be smaller than about 20 um.

In some embodiments, a dielectric structure 80 and an anti-reflection layer 82 are formed in the substrate 10. In some embodiments, the dielectric structure 80 may have a curved surface, which can serve as a curved surface for a lens mirror. In some embodiments, the dielectric structure 80 and the dielectric structure 242 may arrange in the direction perpendicular to the substrate 210, so that light may pass through this direction. In some embodiments, the dielectric structure 80 may include suitably transparent material such as silicon oxide. In some embodiments, the anti-reflection layer 82 may include silicon oxide, silicon nitride, polymer, benzocyclobutene (BCB), or any suitable material, in some embodiments of the present disclosure.

Figure 8A:
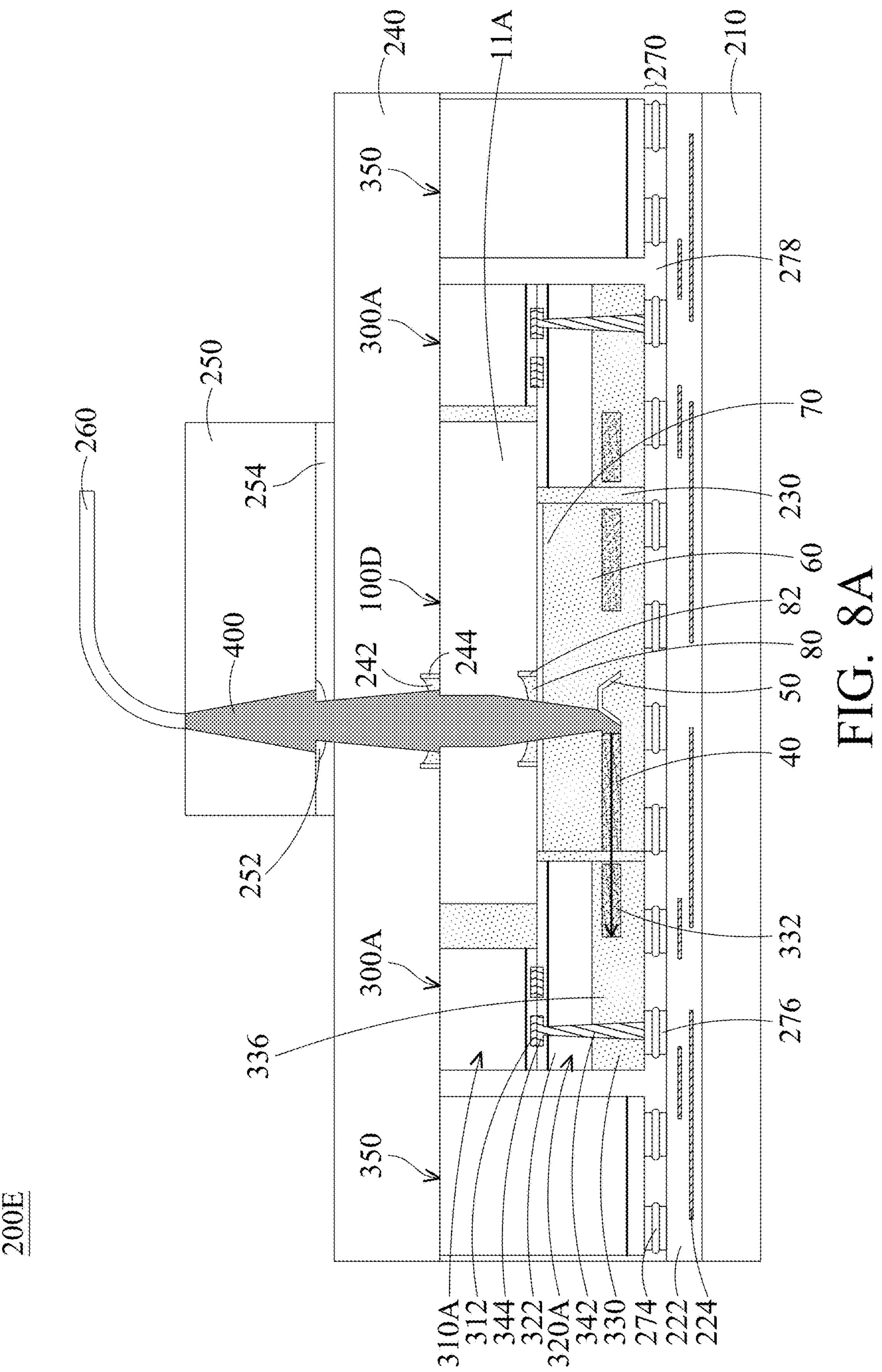
FIG. 8A is a schematic view of a semiconductor package, in accordance with some embodiments of the present disclosure.
Figure 8B:
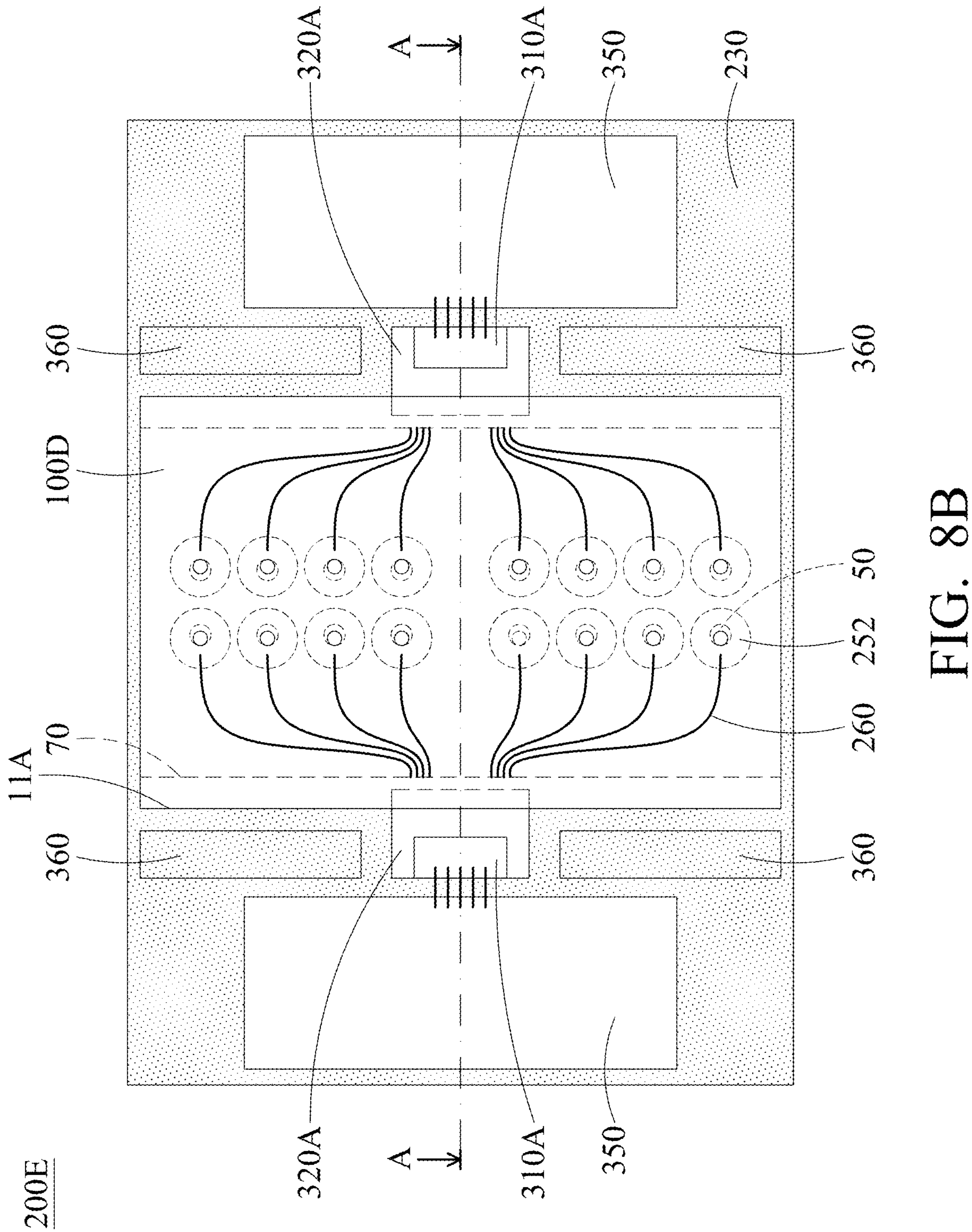
FIG. 8B is a top view of the semiconductor package, in accordance with some embodiments of the present disclosure.

FIG. 8A is a schematic view of a semiconductor package 200E, and FIG. 8B is a top view of the semiconductor package 200E, in accordance with some embodiments of the present disclosure. Identical elements are not described again for simplicity. As shown in FIG. 8A, an optical bridge 100D and optical engine dies 300A are provided, in accordance with some embodiments. In some embodiments, the optical bridge 100D includes a substrate 11A, and the optical engine die 300A includes an electric die 310A and a photonic die 320A. In some embodiments, the substrate 11A extends horizontally above the photonic die 320A and the molding structure 230. In some embodiments, the substrate 11A is in contact with the photonic die 320A. In alternative embodiments, the substrate 11A is separated from the photonic die 320A by the molding structure 230. In some embodiments, a width of the electric die 310A is less than a width of the photonic die 320A. As shown in FIG. 8B, the substrate 11A partially overlaps the photonic die 320A, and it is separated from the electric die 310A. As a result, the size of the electric die 310A may be reduced to achieve miniaturization. Moreover, since substrate 11A extends horizontally above the photonic die 320A, the amount of the molding structure 230 may be reduced to lower the cost.

Figure 9A:
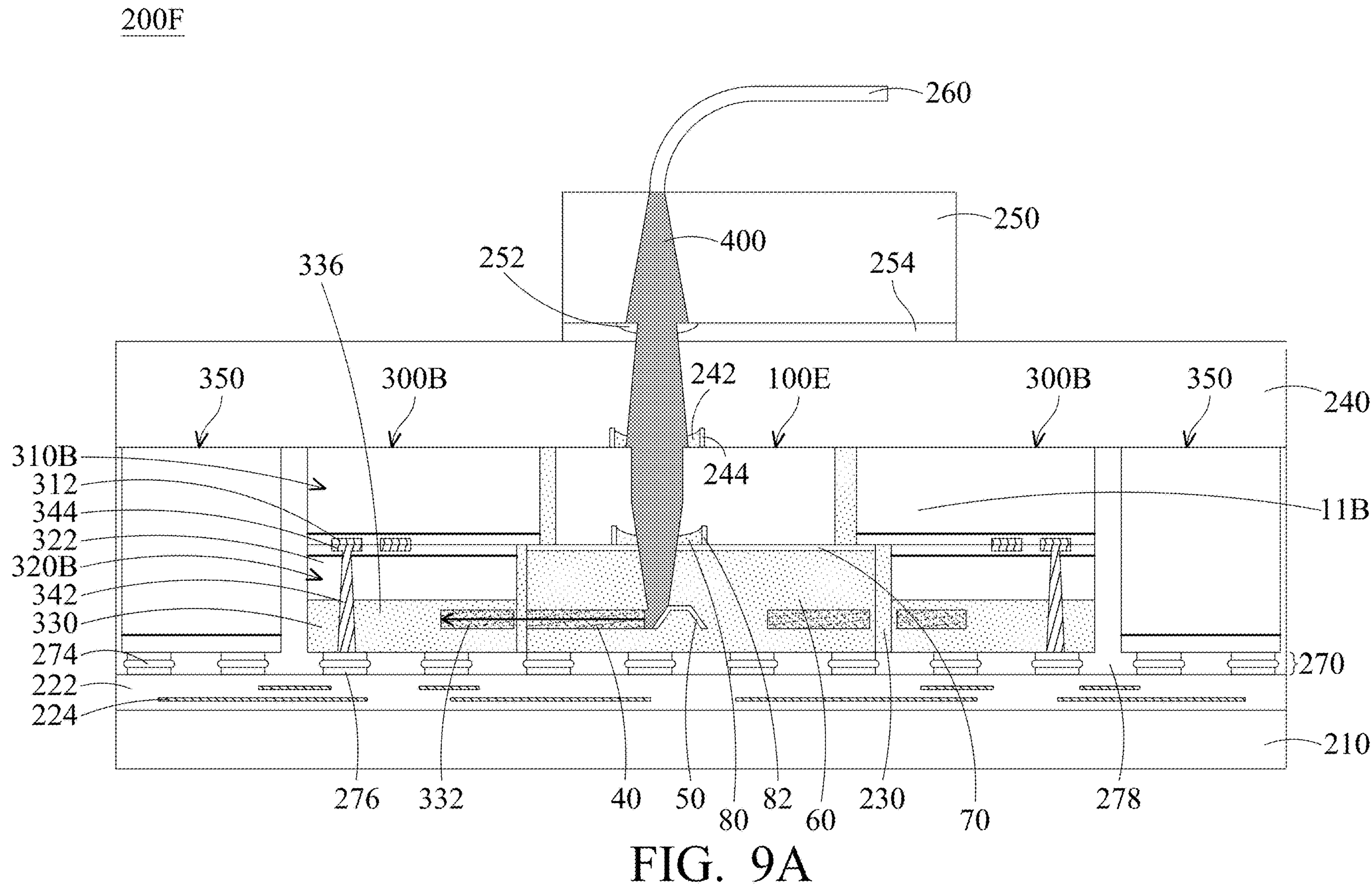
FIG. 9A is a schematic view of a semiconductor package, in accordance with some embodiments of the present disclosure.
Figure 9B:
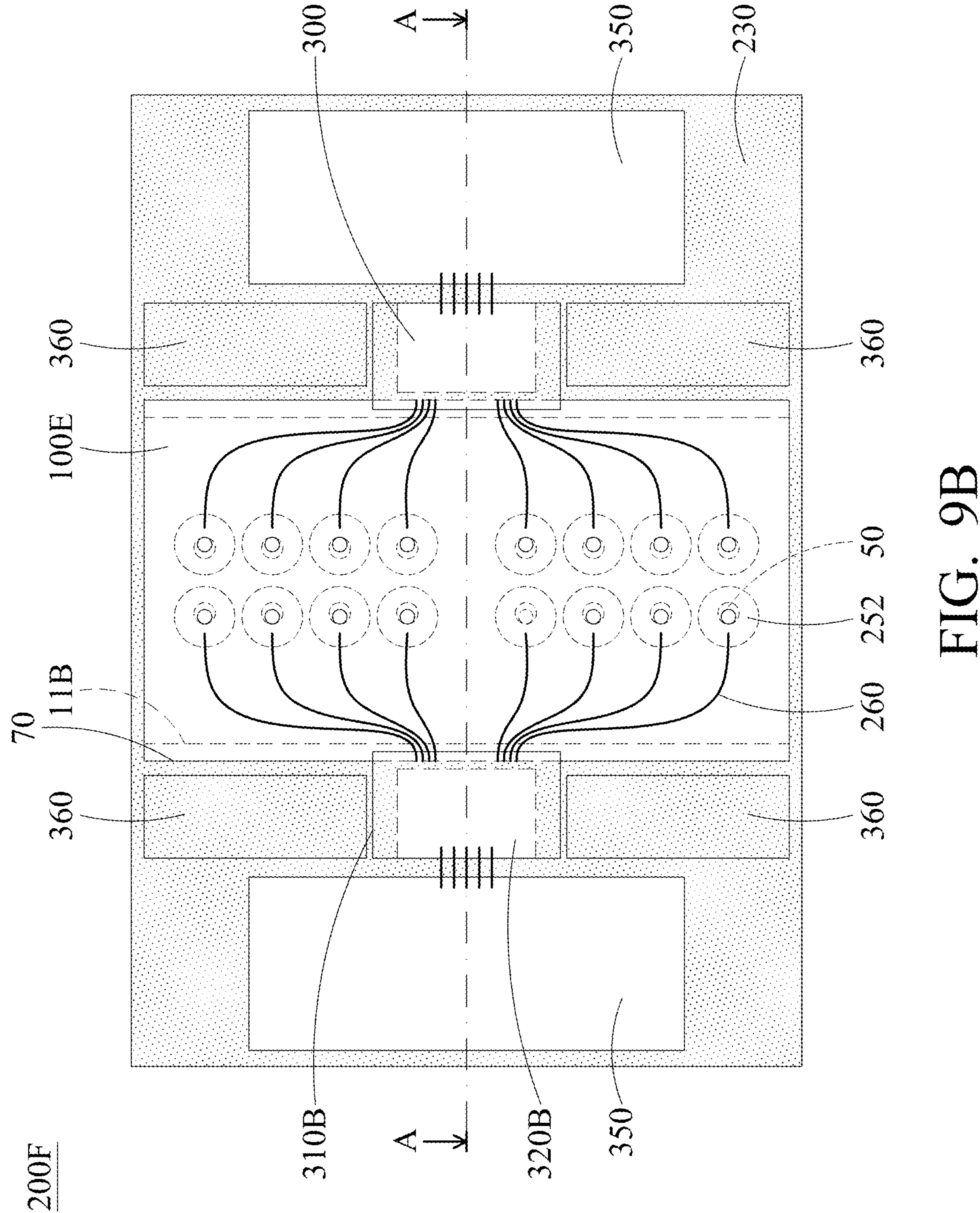
FIG. 9B is a top view of the semiconductor package, in accordance with some embodiments of the present disclosure.

FIG. 9A is a schematic view of a semiconductor package 200F, and FIG. 9B is a top view of the semiconductor package 200F, in accordance with some embodiments of the present disclosure. Identical elements are not described again for simplicity. As shown in FIG. 9A, an optical bridge 100E and optical engine dies 300B are provided, in accordance with some embodiments. In some embodiments, the optical bridge 100E includes a substrate 11B, and the optical engine die 300B includes an electric die 310B and a photonic die 320B. In some embodiments, the electric die 310B extends horizontally above the dielectric layer 70 and the molding structure 230. In some embodiments, the electric die 310B is in contact with the dielectric layer 70. In alternative embodiments, the electric die 310B is separated from the dielectric layer 70 by the molding structure 230. In some embodiments, a width of the electric die 310A is greater than a width of the photonic die 320A. As shown in FIG. 9B, the electric die 310B partially overlaps the dielectric layer 70. As a result, the area of the electric die 310B may be increased to allow more electric elements being disposed therein.

Figure 10A:
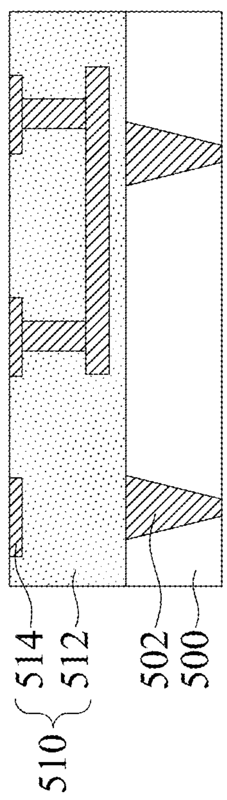
FIG. 10A to FIG. 10D are schematic views of a method for forming a semiconductor package, in accordance with some embodiments of the present disclosure.

FIG. 10A to FIG. 10D are schematic views of a method for forming a semiconductor package 200G, in accordance with some embodiments of the present disclosure. As shown in FIG. 10A, a package components 500 is provided. In accordance with some embodiments, the package component 500 include a logic die, which may be a Central Processing Unit (CPU) die, a Graphic Processing Unit (GPU) die, a mobile application die, a Micro Control Unit (MCU) die, an input-output (IO) die, a BaseBand (BB) die, an Application processor (AP) die, or the like. Package components 36 may also include memory dies such as Dynamic Random-Access Memory (DRAM) dies, Static Random-Access Memory (SRAM) dies, or the like. The memory dies may be discrete memory dies, or may be in the form of a die stack that includes a plurality of stacked memory dies. The package component 500 may also include System-on-Chip (SOC) dies. The package component 500 may be discrete device dies or packages, in accordance with some embodiments.

In some embodiments, conductive features 502 may be formed in the package component 500. In some embodiments, the conductive features 502 may be vias, conductive pads, or conductive lines, and may be made of or include copper, aluminum, cobalt, nickel, gold, silver, tungsten, one or more other suitable materials, or a combination thereof.

In some embodiments, as shown in FIG. 10A, a redistribution structure 510 is disposed on the package component 500. In some embodiments, the redistribution structure 510 includes multiple insulating layers 512 and conductive features 514. The conductive features 514 may include conductive lines, conductive vias, and/or conductive pads. In some embodiments, the insulating layers 512 may be made of or include a polymer material, a ceramic material, a metal material, a semiconductor material, one or more other suitable materials, or a combination thereof. In some embodiments, the conductive features 514 may be made of or include copper, aluminum, cobalt, nickel, gold, silver, tungsten, one or more other suitable materials, or a combination thereof.

Figure 10B:
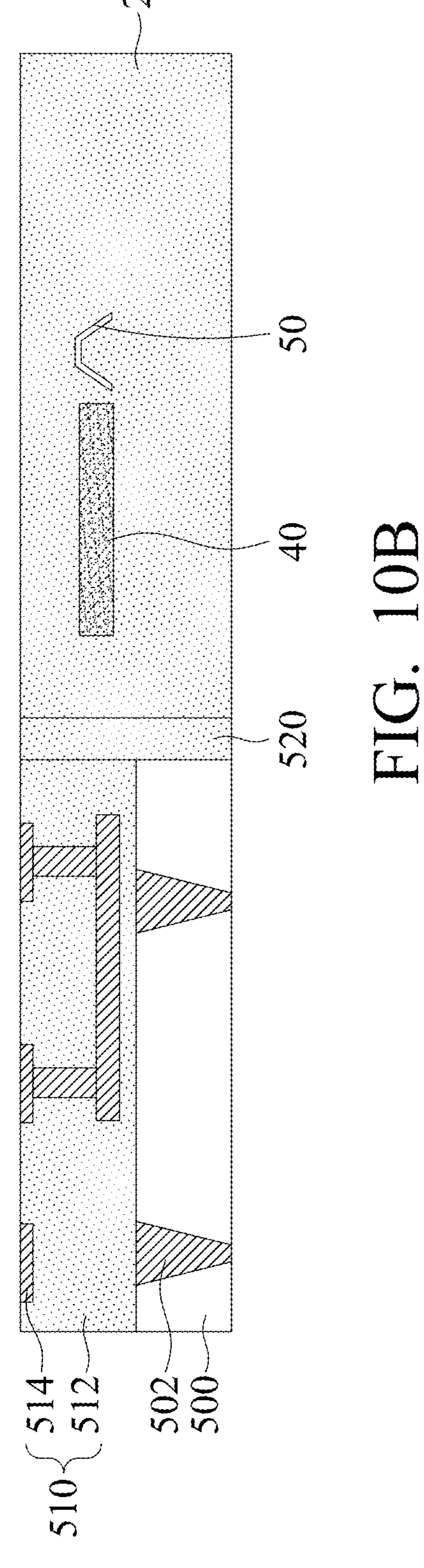

As shown in FIG. 10B, a first photonic routing structure R1 is disposed adjacent to the package component 500 and the redistribution structure 510, in accordance with some embodiments of the present disclosure. In some embodiments, the first photonic routing structure R1 has an oxide layer 20 with a first waveguide 40 and a reflective element 50 disposed therein, and a dielectric layer 70 disposed on the oxide layer 20. In some embodiments, a dielectric material 520 is dispensed (e.g., by a dispenser (not shown)) into the space between the oxide layer 20 and the package component 500 and the redistribution structure 510, and then cured (e.g., ultraviolet (UV) or thermally cured) to harden. The dielectric material 520 may be configured to provide a stronger mechanical connection and a heat bridge between the elements, to reduce cracking in the semiconductor package 200G caused by thermal expansion mismatches, and to protect the joints from contaminants, thereby improving reliability of the fabricated semiconductor package 200G. In some embodiments, the dielectric material 520 includes liquid epoxy, deformable gel, silicon rubber, or the like.

Figure 10C:
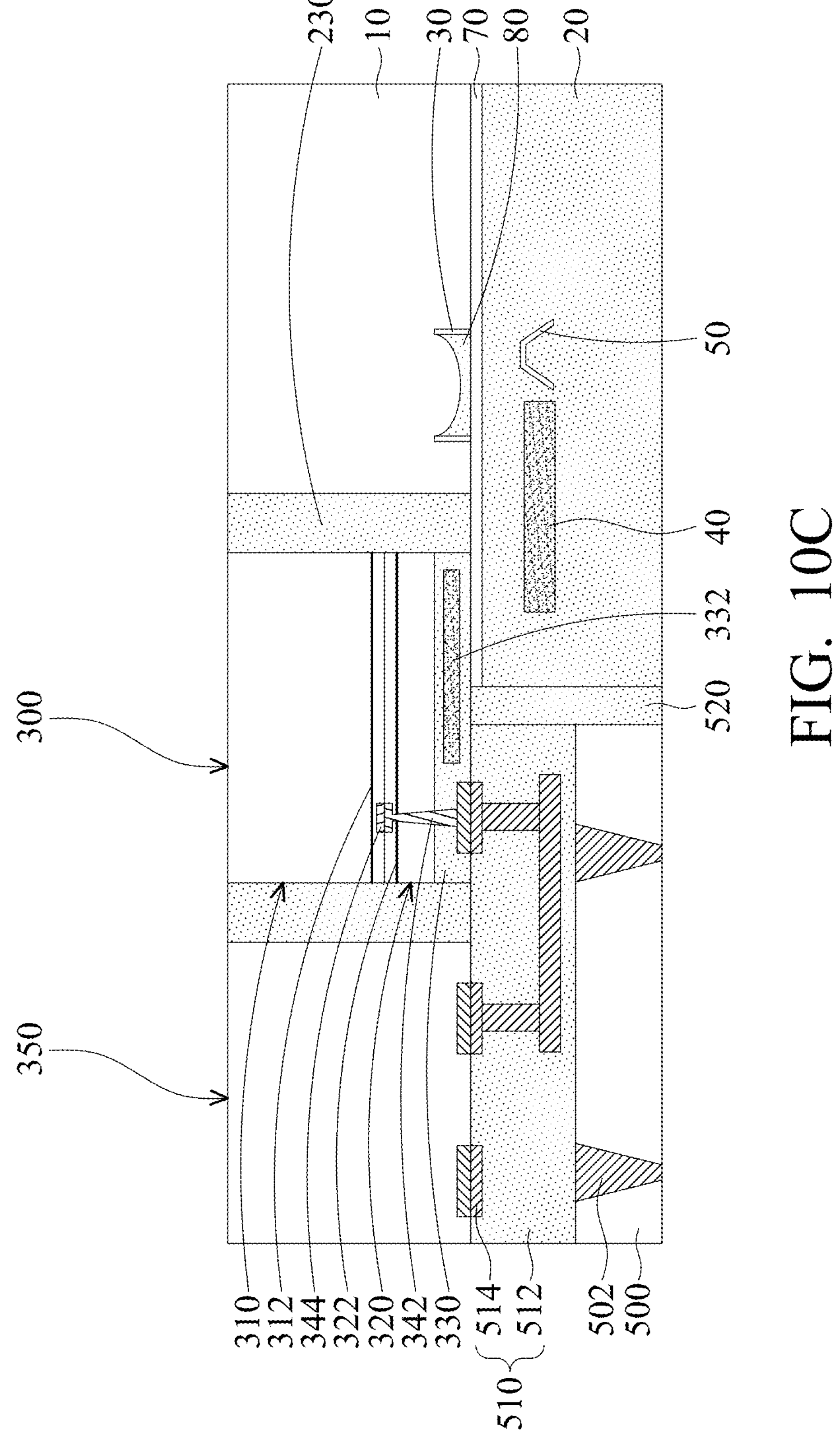
Figure 10D:
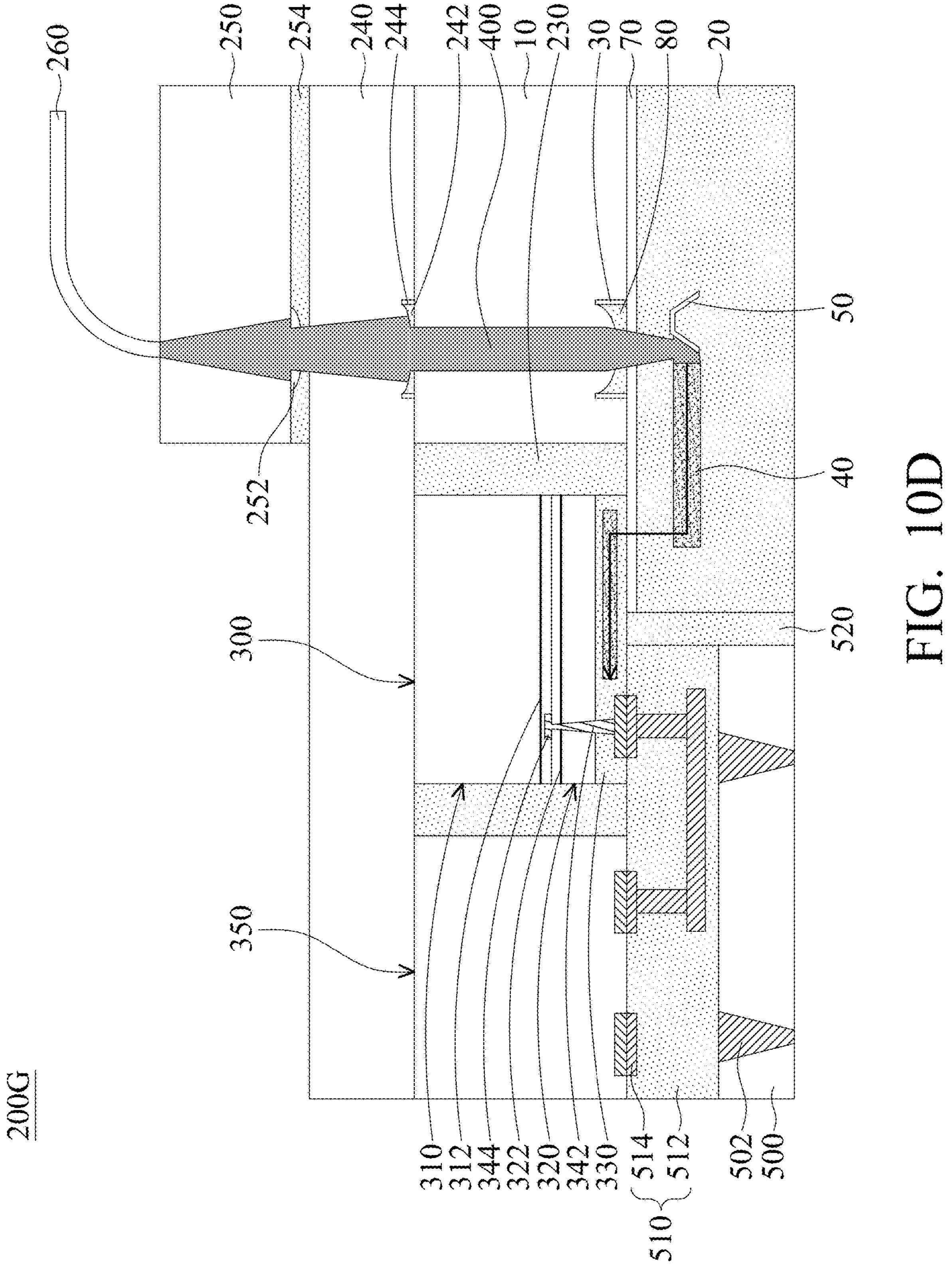

In FIG. 10C, a substrate 10 having a dielectric structure 80 and an anti-reflection layer 82, an optical engine dies 300, and a die 350 are disposed on the structure shown in FIG. 10B. Next, as shown in FIG. 10D, a support substrate 240 is disposed on the substrate 10, the optical engine die 300, and the die 350, in accordance with some embodiments of the present disclosure. In some embodiments, a dielectric structure 242 and an anti-reflection layer 244 are formed in the support substrate 240. In some embodiments, the dielectric structure 242 may have a curved surface, which can serve as a curved surface for a lens mirror.

In some embodiments, a dielectric structure 250 is disposed on the support substrate 240, in accordance with some embodiments of the present disclosure. In some embodiments, a protrusion 252 is formed on a bottom surface of the dielectric structure 250, and a dielectric material 254 is disposed between the support substrate 240 and the dielectric structure 250 and surrounding the protrusion 252. An optical fiber 260 is connected to the dielectric structure 250, in accordance with some embodiments of the present disclosure.

In some embodiments, the first photonic routing structure R1, the substrate 10, the dielectric structure 80, and the anti-reflection layer 82 may be collectively referred to as an optical bridge 100F. In some embodiments, a molding structure 230 is formed to surround the optical bridge 100F, the optical engine die 300, and the die 350, in accordance with some embodiments of the present disclosure. In some embodiments, the dielectric layer 70 may be omitted, and the substrate 10 may be in direct contact with the oxide layer 20. In this configuration, light 400 may pass through the optical bridge 100F to reach the photonic die 320.

In summary, semiconductor packages having optical bridges and forming methods thereof are provided in some embodiments of the present disclosure. The optical bridge acts as an optical path for light signal to be transmitted, which relieves the areal restriction of the optical engine die, enhances the performance of the semiconductor package, simplifies the process, and increases the yield.

A method for forming a semiconductor package is provided in some embodiments of the present disclosure. The method includes forming a first photonic routing structure over a substrate, disposing the first photonic routing structure over a redistribution structure, disposing a second photonic routing structure and an optical engine die on the redistribution structure and forming a molding structure between and separating the first photonic routing structure and the second photonic routing structure.

A method for forming a semiconductor package is provided in some embodiments of the present disclosure. The method includes forming a redistribution structure on a substrate, disposing a first photonic routing structure on the redistribution structure, and disposing a second photonic routing structure and an optical engine die on the redistribution structure, wherein the second photonic routing structure comprises a second dielectric structure and a second waveguide disposed in the second dielectric structure, the optical engine die is disposed on the second photonic routing structure, and the second waveguide is optically coupled to the first waveguide and the optical engine die. In some embodiments, disposing a first photonic routing structure on the redistribution structure includes forming a recess having a curved surface in an optical interposer die, forming a first dielectric structure covering the curved surface, wherein a first waveguide is embedded in the first dielectric structure, and forming a reflective element over the first dielectric structure.

A semiconductor package is provided in some embodiments of the present disclosure. The semiconductor package includes a substrate, a redistribution structure disposed on the substrate, a first photonic routing structure disposed on the redistribution structure, an optical interposer die disposed on the first photonic routing structure, a second photonic routing structure disposed on the redistribution structure, an optical engine die disposed on the second photonic routing structure, a molding structure disposed between and separating the first photonic routing structure and the second photonic routing structure, in accordance with some embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor package, comprising:

forming a first photonic routing structure over a substrate, comprising:

forming a curved surface over the substrate;

forming an oxide layer over the curved surface;

recessing the oxide layer to expose the curved surface; and forming a reflective element over the curved surface;

disposing the first photonic routing structure over a redistribution structure, wherein the first photonic routing structure comprises a first waveguide;

disposing a second photonic routing structure and an optical engine die on the redistribution structure, wherein the second photonic routing structure comprises a second waveguide optically coupled to the first waveguide; and forming a molding structure between the first photonic routing structure and the second photonic routing structure.

2. The method for forming a semiconductor package as claimed in claim 1, wherein the molding structure is formed between the substrate and the optical engine die.

3. The method for forming a semiconductor package as claimed in claim 1, wherein the molding structure comprises optical clear adhesive.

4. The method for forming a semiconductor package as claimed in claim 1, further comprising forming a dielectric layer between the substrate and the first photonic routing structure.

5. The method for forming a semiconductor package as claimed in claim 1, wherein the first photonic routing structure comprises a mirror formed by high-refractive coating film, and the substrate has a curved surface arranged with the mirror in a first direction perpendicular to the substrate.

6. The method for forming a semiconductor package as claimed in claim 5, wherein the mirror is arranged with the first waveguide in a second direction different from the first direction.

7. A method for forming a semiconductor package, comprising:

forming a redistribution structure on a substrate;

disposing a first photonic routing structure on the redistribution structure, comprising:

forming a recess having a curved surface in an optical interposer die;

forming a first dielectric structure covering the curved surface, wherein a first waveguide is embedded in the first dielectric structure; and forming a reflective element over the first dielectric structure;

disposing a second photonic routing structure and an optical engine die on the redistribution structure, wherein the second photonic routing structure comprises a second dielectric structure and a second waveguide disposed in the second dielectric structure, the optical engine die is disposed on the second photonic routing structure, and the second waveguide is optically coupled to the first waveguide and the optical engine die.

8. The method for forming a semiconductor package as claimed in claim 7, further comprising forming an anti-reflection layer in the first dielectric structure.

9. The method for forming a semiconductor package as claimed in claim 8, wherein forming the anti-reflection layer comprises:

recessing the first dielectric structure to form an opening; and forming the anti-reflection layer on sidewalls of the opening.

10. The method for forming a semiconductor package as claimed in claim 9, wherein a curved surface of the optical interposer die is exposed from the opening, and the curved surface is spaced apart from the anti-reflection layer.

11. The method for forming a semiconductor package as claimed in claim 7, further comprising recessing a first surface of the optical interposer die to form a recess, wherein the recess has a curved bottom surface, and the first surface faces the first photonic routing structure.

12. The method for forming a semiconductor package as claimed in claim 7, further comprising forming an anti-reflection layer on sidewalls of the recess.

13. The method for forming a semiconductor package as claimed in claim 7, wherein a third waveguide is formed in the redistribution structure and optically coupled to the first waveguide and the second waveguide.

14. The method for forming a semiconductor package as claimed in claim 7, wherein a direction that the curved surface arranged with the reflective element is different from a direction that the reflective element arranged with the second waveguide.

15. A semiconductor package, comprising:

a first substrate;

a redistribution structure formed on the first substrate;

a first photonic routing structure disposed on the redistribution structure, comprising:

a second substrate having curved surface;

a first dielectric structure disposed over the second substrate, wherein the curved surface faces the first dielectric structure;

a first waveguide disposed in the first dielectric structure; and a reflective element disposed in the first dielectric structure and overlapping the curved surface;

an optical interposer die disposed on the first photonic routing structure;

a second photonic routing structure disposed on the redistribution structure, wherein the second photonic routing structure comprises a second dielectric structure and a second waveguide disposed in the second dielectric structure and optically coupled to the first waveguide;

an optical engine die disposed on the second photonic routing structure; and a molding structure disposed between the first photonic routing structure and the second photonic routing structure.

16. The semiconductor package as claimed in claim 15, wherein the first photonic routing structure further comprises:

a reflective element disposed in the first dielectric structure.

17. The semiconductor package as claimed in claim 15, wherein the optical interposer die and the optical engine die are arranged in a direction parallel to a surface of the substrate.

18. The semiconductor package as claimed in claim 15, wherein the optical engine die comprises a photonic die disposed on the second photonic routing structure and an electric die disposed on the photonic die, wherein the photonic die and the electric die have different widths.

19. The semiconductor package as claimed in claim 18, wherein the optical interposer die covers a portion of the second photonic routing structure and the molding structure.

20. The method for forming a semiconductor package as claimed in claim 1, wherein the second waveguide is optically coupled to the optical engine.

* * * * *